United States Patent [19]
Cooke et al.

[11] Patent Number: 5,623,501
[45] Date of Patent: Apr. 22, 1997

[54] PREPROGRAMMING TESTING IN A FIELD PROGRAMMABLE GATE ARRAY

[75] Inventors: Laurence H. Cooke; Christopher E. Phillips, both of San Jose; William J. Allen, Cupertino, all of Calif.

[73] Assignee: Crosspoint Solutions Inc., Santa Clara, Calif.

[21] Appl. No.: 285,544

[22] Filed: Aug. 3, 1994

Related U.S. Application Data

[62] Division of Ser. No. 801,237, Dec. 3, 1991, Pat. No. 5,347,519.

[51] Int. Cl.$^6$ ................................................. H04B 17/00
[52] U.S. Cl. ................................................. 371/22.2
[58] Field of Search .......................... 371/22.1, 22.2, 371/22.3, 28, 22.5, 22.6

[56] References Cited

U.S. PATENT DOCUMENTS

| | | | |
|---|---|---|---|
| 3,958,110 | 5/1976 | Hong et al. | 371/22.2 |
| 4,380,811 | 4/1983 | Gotze et al. | 371/10 |
| 4,495,629 | 1/1985 | Zasio et al. | 377/70 |
| 4,609,830 | 9/1986 | Yigal et al. | 307/202.1 |
| 4,642,487 | 2/1987 | Carter | 307/465 |
| 4,689,654 | 8/1987 | Brockman | 357/45 |
| 4,692,923 | 9/1987 | Poeppelman | 371/38 |
| 4,739,250 | 4/1988 | Tanizawa | 371/22.2 |
| 4,758,745 | 7/1988 | Elgamal et al. | 307/465 |
| 4,786,904 | 11/1988 | Graham, III et al. | 340/825.83 |
| 4,857,774 | 8/1989 | El-Ayat et al. | 307/465 |
| 4,870,302 | 9/1989 | Freeman | 307/465 |
| 4,873,459 | 10/1989 | El Gamal et al. | 307/465 |
| 4,910,417 | 3/1990 | El Gamel et al. | 307/465 |
| 4,935,734 | 6/1990 | Austin | 340/825.83 |
| 5,001,368 | 3/1991 | Cliff et al. | 307/465 |
| 5,015,885 | 5/1991 | El Gamal et al. | 307/465 |
| 5,023,485 | 6/1991 | Sweeney | 371/22.2 |
| 5,083,083 | 1/1992 | El-Ayat et al. | 324/158 R |
| 5,121,394 | 6/1992 | Russell | 371/22.1 |
| 5,210,759 | 5/1993 | De Witt et al. | 371/22.3 |
| 5,231,637 | 7/1993 | Tanagawa | 371/22.2 |
| 5,309,091 | 5/1994 | El-ayat et al. | 371/22.2 |
| 5,365,165 | 11/1994 | El-Aayat et al. | 371/22.2 |
| 5,373,510 | 12/1994 | Ha | 371/22.2 |
| 5,532,441 | 7/1995 | El-Ayat et al. | 371/22.2 |

OTHER PUBLICATIONS

Greene et al, "Antifuse Field Programmable Gate Arrays", Proceedings of the IEEE, vol. 81 Iss. 7, Jul. 1993, pp. 1042–1056.

Goldberg et al, "The Structure of Complete Test Sets for Programmable Logic Arrays", European Test Conf., 1993 Pro., pp. 513–514.

Liu et al, "A New Low Overhead Design for Testability of Programmable Logic Arrays", Circuits & Systems, 1991 IEEE Int. Sym., pp. 1972–1975.

El Gamal et al, "An Architecture For Electrically Configurable Gate Arrays", IEEE Journal of Solid State Circuits, vol. 24, Iss. 2 Apr. 1989, pp. 394–398

*Primary Examiner*—Robert W. Beausoliel, Jr.
*Assistant Examiner*—Joseph E. Palys
*Attorney, Agent, or Firm*—Townsend and Townsend and Crew

[57] ABSTRACT

A field programmable gate array integrated circuit which has numerous features for testing prior to programming the antifuses in the integrated circuit is provided. The circuits used to program the antifuses are also used for much of the preprogramming testing. The functionality of continuous series transistors and latch logic blocks may be tested together with the continuity of their programmable connections. Programmable input/output buffer circuits and clock circuits which set the desired clock network paths may be tested with signals on a serial scan path which passes through the input/output buffer circuits and clock circuits. Process characterization tests without the requirement of high-speed test equipment are also provided.

5 Claims, 20 Drawing Sheets

N CHANNEL PROGRAMMING CONNECTIONS

| PROG GRID<br>CONTROL BIT | -PROG5 | -PROG6 | -PROG1 | -PROG2 | -PROG3 | -PROG4 |
|---|---|---|---|---|---|---|
| -Y1 | T1 | T2 | PG1 | PD1 | VC1 | FB |
| -Y2 | T3 | T4 | IN | PG2 | PD2 | LC1 |
| -Y3 | T5 | T6 | VC2 | CLKB | PG3 | PD3 |
| -Y4 | T7 | T8 | PD4 | LC2 | OUT | PG4 |

P CHANNEL PROGRAMMING CONNECTIONS

| PROG GRID<br>CONTROL BIT | +PROG1 | +PROG2 | +PROG3 | +PROG4 | +PROG5 |
|---|---|---|---|---|---|
| +Y1 | NG1 | ND1 | VC2 | T1 | T2 |
| +Y2 | T4 | NG2 | ND2 | LC1 | T3 |
| +Y3 | T5 | T6 | NG3 | ND3 | VC1 |
| +Y4 | ND4 | T7 | T8 | NG4 | LC2 |

FIG. 9.

PREPROGRAMMING TESTING IN A FIELD PROGRAMMABLE GATE ARRAY

This application is a Division of application Ser. No. 07/801/237, filed Dec. 3, 1991, now U.S. Pat. No. 5,347,519.

BACKGROUND OF THE INVENTION

The invention relates generally to the field of testing of integrated circuit devices and, more particularly, to the testing of user-programmable or field programmable gate arrays (FLAGS).

In a field programmable gate array (FAA), the connections between the transistors, logic blocks, and input and output circuits are made by the user of this type of integrated circuit. The transistors, logic blocks, and input and output circuits are connected to line segments which intersect or abut each other at various points. At most of these points programmable elements known as antifuses are located to make a connection between the line segments if desired.

In an unprogrammed state, each antifuse remains in a high impedance, or "open circuit" state. When programmed, the antifuse is in a low impedance, or "closed circuit" state. The antifuses in the FPGA are selectively programmed by the user to make desired interconnections between the transistors, logic blocks and input and output circuits of the FPGA for a particular application. In this manner an FPGA is configured for a particular application.

It is thus highly desirable for a FPGA to be tested prior to its programming to check the functionality of the various elements of the FPGA, including its line segments and antifuses. Heretofore, if provisions had been made for the testing of a FPGA, special test transistors and circuits were added to the integrated circuit. These additions increased the complexity and space requirements for what is typically an already complex and crowded integrated circuit.

A typical FPGA integrated circuit has specified programming pins by which large voltages are introduced into the circuit for the programming of antifuses. In the FPGA of the present invention, the input/output buffer circuits are provided with a serial scan path for test signals according to the IEEE 1149.1 test standards. During the programming of the antifuses, signals in the 1149.1 serial scan path become control signals for the programming circuits which address wiring segments to specify the particular antifuses to be programmed while the programming voltages are supplied through the specified pins.

In accordance to the present invention, the programming circuits controlled by signals in the serial scan path and the specified programming pins are used to provide paths for testing the FPGA prior to the programming of the antifuses. In this manner the present invention is able to achieve the goals of testing the elements and functions of an FPGA with a minimal amount of additional transistors and circuits.

SUMMARY OF THE INVENTION

Thus the present invention provides for an integrated circuit which has a plurality of terminals for providing electrical paths to and from said integrated circuit. The integrated circuit also has an array of functional units and a plurality of line segments connected to the functional units. Programmable elements are located between two line segments. These elements are programmable by a programming voltage across the two line segments. The integrated circuit has address circuits connected to each of the line segments for connecting a selected line segment responsive to address signals to a voltage supply or to one of the terminals. The units may be tested by selecting line segments connected to a unit and monitoring the unit through the line segments. The address circuits may also program the elements by selecting line segments having the elements between the selected line segments. Thus the address circuits may be used for programming the programmable elements and for testing units in the array.

The array of functional units include continuous series transistors and circuit blocks which may be configured for memory and logic functions.

Testing also includes testing of the functionality of each of these functional units, and the electrical continuity of various line segments.

The integrated circuit also has input/output buffer circuits which are programmable to set various operating parameters of the input/output buffer circuit. The present invention incorporates a serial scan path which is used nominally for testing an integrated circuit for carrying control signals to temporarily set the various operating parameters of the input/output buffer circuit for testing prior to programming.

The integrated circuit has clock circuits which are programmable to set or define the desired clock network path for the integrated circuit. In the serial scan path, the clock circuits are temporarily set by signals on the serial scan path so that the various network clock paths may be tested prior to programming. In this clock network testing the address circuits used for programming are also used.

The present invention also provides for process characterization tests of the integrated circuit without the requirement of high-speed test equipment. A small portion of the programmable elements is programmed to form a series of inverters. A ring oscillator loop is formed with the serial scan path through the input/output buffer circuits and the programmed series of inverters. A counter operating at much lower speeds than if the counter were testing the programmed inverter series by itself is sufficient for the process characterization.

Thus the present invention provides for these and other features which will be apparent below.

BRIEF DESCRIPTION OF THE DRAWINGS

A detailed understanding of the present invention may be attained by a perusal of the following Description of the Specific Embodiments with reference to the drawings below:

FIG. 9 is a table of wiring segments of a four-tile section in a CST row, its programming grid, ±Y control line for a given ±Y address.

DESCRIPTION OF THE PREFERRED EMBODIMENT(S)

For an understanding of the various test operations of the FPGA according to the present invention, an understanding of the various parts of the FPGA is very helpful. Thus an explanation of the organization of the FPGA and its parts follows. It should be understood, though, that many of the test operations described herein have applications beyond FPGAS.

Organization of the FPGA

Figure 1:
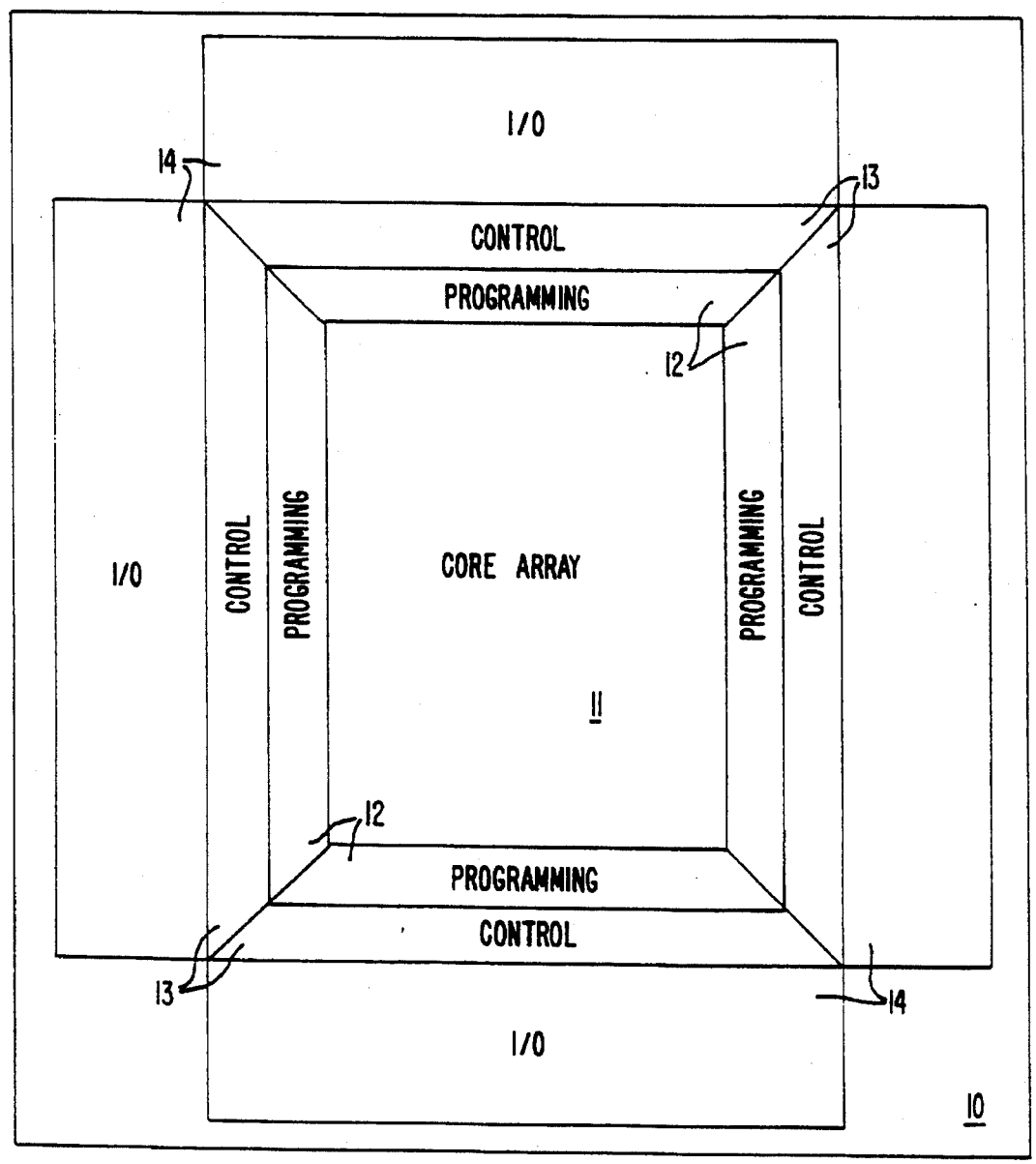
FIG. 1 is a general top view of a FPGA integrated circuit implementing the present invention.

A top view of an field programmable gate array (FPGA) integrated circuit according to the present invention is illustrated in FIG. 1. The drawing shows the general organizational layout of the FPGA. On a semiconductor substrate 10 the FPGA has a central core array section 11, which contains continuous-series transistors (CST), latch/logic blocks (LLB) and antifuses which are programmed to configure the transistors and blocks for the user's application.

Surrounding the core array section 11 is a programming section 12, here shown as four separate areas, which contain the circuits for programming the antifuses in the core array 11. Included in this section 12 is circuitry for controlling the special programming voltages, $V_{pp}$ and $V_{ss}$, in the array 11 for programming the antifuses. On the outside of this programming section 12 is a control section 13, again shown as four separate areas, which contains the control circuitry used for addressing the wiring segments in programming the selected antifuses and for testing.

Finally, an input/output section 14 is located on the periphery of the substrate 10. The section 14 contains the input and output circuitry for receiving signals from the outside world into the FPGA interior and for driving signals from the interior of the FPGA to the outside world.

An antifuse is a programmable element which is placed between two conducting layers of the FPGA integrated circuit. The type of antifuse contemplated in the present invention has a high resistance of several giga-ohms in the unprogrammed state and a low resistance, say, 100–150 ohms, in the programmed state. The unprogrammed antifuses have a very low parasitic capacitance, below 2 fF.

A specific example of an antifuse useful in the present invention is a structure made of amorphous silicon which fits into a normal contact between a metal 1 layer and a polysilicon layer. This structure is disclosed in U.S. Pat. No. 4,796,074, issued to B. Roesner on Jun. 3, 1989. Another useful antifuse structure is formed between any two metal interconnection layers of an integrated circuit. This structure is disclosed in U.S. patent application Ser. No. 07/642,617, entitled, "AN IMPROVED ANTIFUSE CIRCUIT STRUCTURE FOR USE IN A FIELD PROGRAMMABLE GATE ARRAY AND METHOD 0F MANUFACTURE THEREOF," filed by M. R. Holzworth et al. on Jan. 17, 1991, and assigned to the present assignee.

The Core Array

Figure 2:
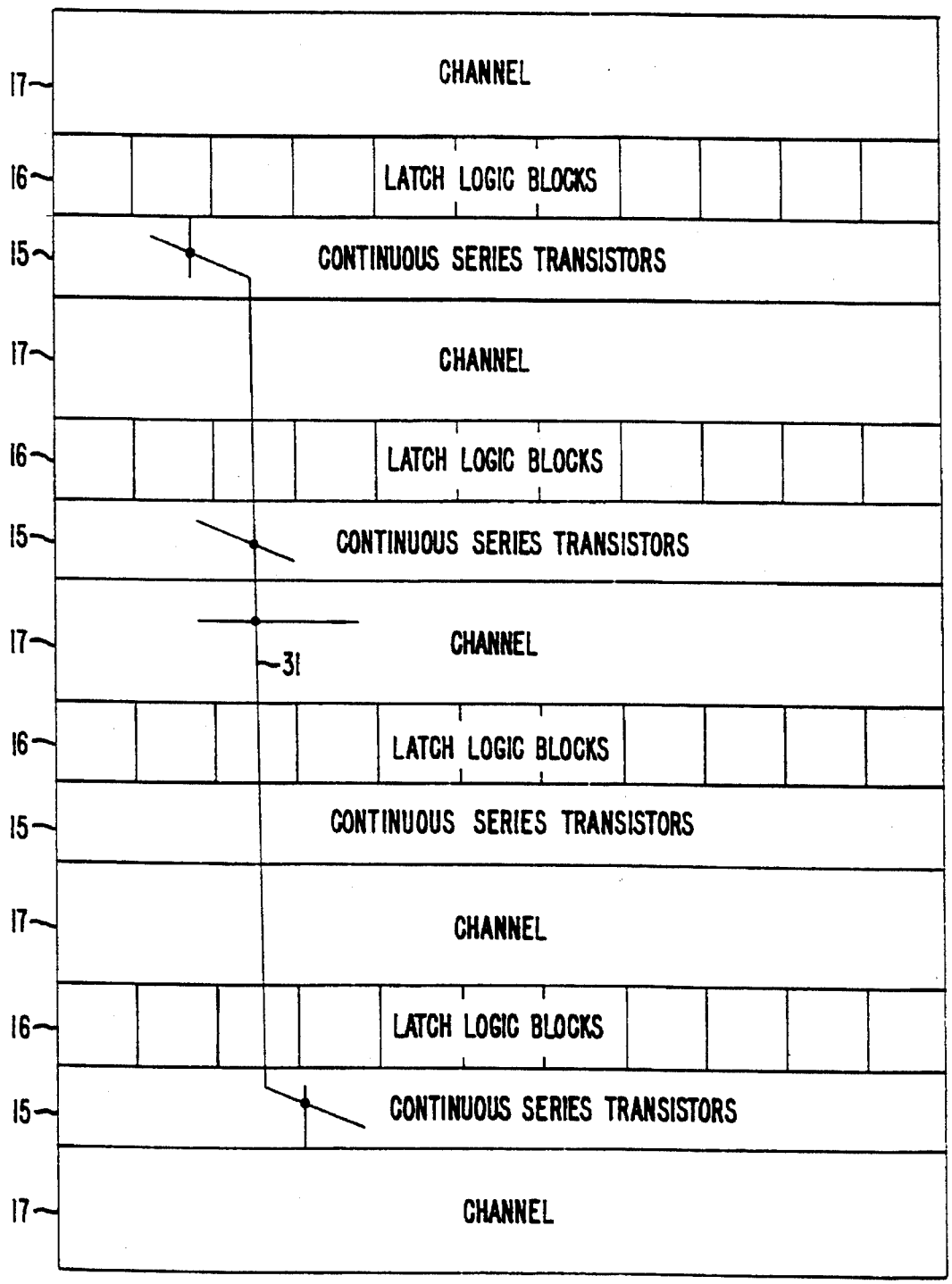
FIG. 2 is a general top view of the core array of the integrated circuit of FIG. 1.

FIG. 2 shows a representational view of the FPGA core array 11. The array 11 has horizontal CST rows 15 and LLB rows 16 which are interleaved with horizontal wiring channels 17 between the CST and LLB rows 15 and 16. The CST rows 15 are used to implement different logic cells, from standard drive to high drive inverters, from multiple input NAND and NOR gates, to more complex AOI (AND-or-invert) cells. These rows 15 can also implement multiplexer-based logic cells. However, the adjacent LLB rows 16, each of which contains a row of preconfigured logic blocks as indicated by the vertical lines in the rows 16, are more efficient for implementing such cells.

In the rows 15 and 16 and channel 17 are horizontal and vertical wiring segments. At the intersection of many of the segments are antifuses, which, when programmed, electrically connect intersecting segments together. These antifuses are located mostly at the intersection of the wiring segments in the CST rows 15 and the channels 17. The CST rows 15 can be flexibly configured into the desired logic cells and the channels 17 can make the required intercell connections.

Thus cell functions and circuit connections are defined by programming the appropriate antifuse element which then forms a low resistance connection between intersecting horizontal and vertical wiring segments. The CST rows 15 and LLB rows 16 are logically and interconnectedly configurable and can implement nearly any combinatorial logic or storage logic cell possible in present MPGAs. This is discussed in more detail below.

The Wiring Channels and Vertical Routing

For purposes of explanation, some terms are now defined. The term "column" is used to indicate a vertical slice in the core array 11 having a width occupied by an opposing pair of transistors, i.e. a PMOS and a NMOS transistor, in a CST row 15. The term "tile" refers to that portion of a column in a CST row 15.

Broadly speaking, the wiring channels 17 are used to make the horizontal connections between the configured cells in the CST rows 15 and the LLB rows 16. The channels 17, which are interleaved with the CST rows 15 and LLB rows 16, contain horizontal segmented wiring tracks of different segment lengths. These horizontal wiring track segments vary from a minimum length of eight columns to the entire width of the array 11. The different segment lengths serve different purposes and increase the utility of the channels 17. For example, the horizontal track segments which minimally span eight columns primarily are used to make feedback connections to the latch/logic blocks in the LLB rows 16 to configure the blocks into latches, flip-flops, and RAM cells, as explained below.

Included within each channel 17 are also clock lines to be used as global clock signals, global enable or reset signals, or any other high fanout signal in the user's application. The clocks are driven from driver circuits along the sides of each channel 17 of the array 11, as discussed more fully below.

Intersecting the horizontal segments in the channels 17 are vertical wiring segments to accommodate vertical connections between circuit nodes in the CST rows 15 and LLB rows 16. Antifuse elements, indicated by a square at the intersection of two lines in the drawings of this patent application, are located at the intersections of the horizontal and vertical wire segments in the channel 17. Each channel 17 is a grid of horizontal and vertical wiring segments which have an antifuse at nearly every intersection.

Three types of vertical wiring are used in the core array 11. The first type is formed by a segment connected to a PMOS or NMOS transistor gate or a latch segment. Both are described in more detail below with respect to FIG. 3. This type of vertical segment forms a route from a horizontal wire segment in an adjacent channel 17 to the cell in the CST row 16 or LLB row 15.

The second type of vertical wiring is a vertical chevron. As illustrated in FIG. 2, each of these vertical wiring segments 31 span four CST rows 15 and intervening LLB rows 16. The chevrons 31 start and end on the CST rows 15. The term "chevron" is used because these wiring segments have a diagonal wire portion (or half chevron) in the rows 15 in which the vertical chevrons 31 start and end. The diagonal wire portions horizontally span five tiles. The central vertical portion of each vertical chevron passes through three wiring channels 17 and two rows 15. As symbolically indicated in FIG. 2, each vertical chevron 31 may be connected through antifuses along either diagonal end portion to vertical segments in the rows 15 or along the center portion of the segment 31 which passes through the channels 17 and rows 15 to horizontal segments in the channels 17 and rows 15. In passing, it should be noted that the horizontal segments in the rows 15 are actually diagonal.

Figure 3:
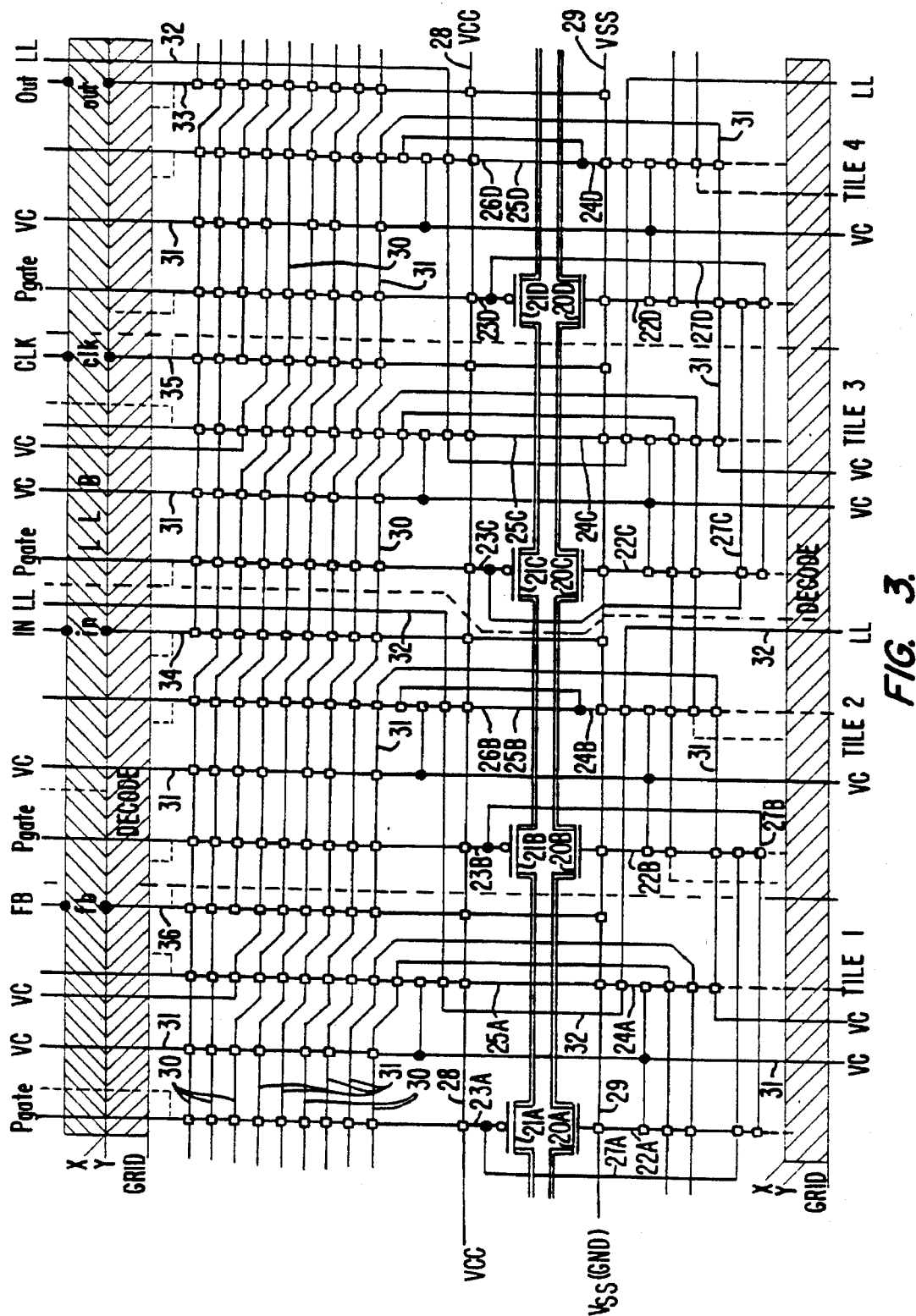
FIG. 3 is a detailed view of a CST row in the core array in FIG. 2.

FIG. 3 described below with respect to the CST row 15 also shows how the vertical chevrons 31 are mapped on to the core array 11. The pattern is regular and repeats horizontally every four tiles and vertically every row 15. A full vertical chevron exists for every two tiles, with a diagonal segment every tile. Two vertical chevrons feed through every two CST tiles and end on different rows.

The third type of vertical wiring segment is a long line. Long lines extend long distances from the top to the bottom of the core array to make long vertical connections primarily. Generally these wiring segments extend either the entire distance, ½ the distance, or ⅓ (⅔) the distance of the core array height. Long lines are horizontally spaced so that a long line passes through a CST row 15 every two tiles. These line segments are lightly loaded since they are intended to be used to route signals over long distances. The primary means for driving a long line is with a standard or high drive inverter.

The CST Row

The CST rows 15 offer the configurability of a MPGA with nearly matching performance. Small logic gates, such as NAND, NOR, AND, OR and inverters, are efficiently configured in the CST rows 15. Each of the transistors in the rows 15 have wiring segments connected to its source/drains and gate electrode. Other wiring segments travel to different parts of the core array. All of these wiring segments intersect with each other and antifuses are placed between these intersecting segments. By programming selected antifuses, the transistors of the CST rows 15 may be configured into the desired block.

FIG. 3 illustrates the arrangement of a portion of a CST row 15 and related wiring segments. Each row 15 contains two strings of continuous-series transistors with one string formed from NMOS transistors and the other with PMOS transistors. In the drawings a PMOS transistor is denoted by a circle on the gate of the MOS transistor symbol. Furthermore, in FIG. 3 the merging of the source/drain of one CST transistor into the source/drain of another transistor is indicated by the double line connecting the source/drains of the transistors.

Four NMOS transistors 20A–20D and four PMOS transistors 21A–21D are shown. It should be understood that these transistors 20A–20D and 21A–21B are connected by their source/drains to other transistors in the row 15 which are not shown in the drawing.

Each of the gates of the NMOS transistors 20A–20D are connected to N gate wiring segments 22A–22D. Correspondingly, P gate wiring segments 23A–23D are respectively connected to each of the gates of the P transistors 21A–21D. These wiring segments 22A–22D and 23A–23D are run perpendicularly, or vertically, with respect to the alignment of the CST transistors 20A–20D and 21A–21D.

Wiring segments 24A–24D and 25A–25D are also connected to the respective source/drains (SD) of the NMOS and PMOS transistors 20A–20D and 21A–21D. For illustrative and labelling purposes, in FIG. 3 the source/drain to the right of each MOS transistor 20A–20D and 21A–21D is associated with the transistor. Thus each NMOS transistor 20A–20D has N SD wiring segments 24A–24D respectively connected to the source/drain of each NMOS transistor and each PMOS transistor 21A–21D has P SD wiring segments 25A–25D respectively connected to the source/drain of each PMOS transistor. These SD wiring segments 24A–24D and 25A–25D also run vertically. All the P gate and P SD segments 22A–22D and 24A–24D can be connected to a $V_{cc}$ power supply wire 28 running along the length of each CST row 15. Likewise, all N gate and N SD segments 23A–23D and 25A–25D can be connected to a $V_{ss}$ power supply wire 29 running along the length of each CST row 15. As in some CMOS integrated circuits, $V_{cc}$ is at +3.5 volts and $V_{ss}$ is at ground, or 0 volts, but other voltages could be used.

All P gate segments 22A–22D and latch segments 33–36, which are connected to input and output terminals of the LLBs 40, discussed below, extend up into the channel 17 above and have connections to all wiring segments in the channel.

Running diagonally are an array of wiring segments 30 and 31. One half of these segments are vertical chevrons 31, mentioned previously, used for intercell routing. The other half are local chevrons 30 for intracell routing. The local chevrons 30 horizontally span nine tiles of a CST row 15. There is one local chevron 30 horizontally for every two tiles. The vertical chevrons 31 horizontally span five tiles and there is one diagonal portion of a vertical chevron 31 for each tile. The local and vertical chevrons 30 and 31 intersect the P gate wiring segments 22A–22D, P SD segments 24A–24D, vertical sections of vertical chevrons 31 from CST rows above and below, and latch segments. The latch segments, along with the P gate segments, are wiring segments which run from a CST row 15 through a LLB row 16 to the channel 17 above. In FIG. 3 latch segments 33, 34, 35 and 36, labeled respectively (Data) OUT, (Data) IN, CLK (Clock) and FB (FeedBack), are shown. The vertical wiring long line 32, mentioned previously for distant intercell connections, is also shown.

The chevrons 30 and 31 also bridge the PMOS transistors 20A–20D and NMOS transistors 21A–21D, and horizontally span two of the N SD segments 25A–25D. The chevrons 30 and 31 span is longer on the PMOS transistor side than on the NMOS side because for the particular embodiment being discussed, the chevrons 30 and 31 are formed from metal on the P side and from more resistive polysilicon on the N side.

Even without the local and vertical chevrons 30 and 31, directly opposing N SD segments 25A–25D and P SD segments 24A–24D may also be fused together with special SD crossover segments 26B and 26D. These segments 26B and 26D are used primarily to implement inverter and pass gate circuits.

The N gate segments 23A–23D and the P gate segments 22A–22D also have special gate crossover segments 27A–27D, which may connect not only directly opposing gate segments, but also gate segments to the immediate left or right. The gate segment crossover segments 27A–27D connected to directly opposing gate segments 22A–22D and 23A–23D are the primary means for connecting the N gate segments 23A–23D for the signal input line for nearly all configured logic cells. The crossover segments 27A–27D connected to the gate segments to the immediate right or left are typically used to implement multiplexer-based blocks in the row 15, although the LLBs, discussed below, may better implement such multiplexer-based cells.

Logic cells configured in a CST row 15 may be isolated from each other by connecting intervening transistors in the row 15 by appropriate connections to the power supply lines at $V_{cc}$ and $V_{ss}$. For a PMOS transistor, the gate electrode is connected to $V_{cc}$. The PMOS transistor is effectively kept from being turned on; no current passes through the source/drains of the transistor. The PMOS transistors forming the logic cells on either side of the isolating transistor are electrically isolated from the other. Likewise, the gate electrode of a NMOS transistor in a CST row 15 is connected to $V_{ss}$ to keep the transistor from being turned on. The transistor becomes an effective isolation between NMOS transistors forming configured logic cells on either side.

As shown in FIG. 3A, at the left boundary of the core array 11 are two vertical conducting lines which connect all the leftmost source/drain regions of the PMOS transistors and all the leftmost source/drain regions of the NMOS transistors of the each of the CST rows 15 respectively. These vertical conducting lines and leftmost PMOS and NMOS CST transistors are used in a process characterization test, which is described later.

Examples of how the CSTs may be connected into logic circuits are shown in U.S. Ser. No. 07/671,222, entitled, "A Field Programmable Gate Array," filed Mar. 18, 1991 by Laurence H. Cooke and David Marple, and assigned to the present assignee, The LLB Row The latch/logic blocks (LLBs) 40 of the rows 16 can implement multiplexer-intensive cells, such as latches, flip-flops, EXCLUSIVE-NOR (XNOR) logic gates, adders, and multiplexers, more efficiently than a configured circuit in the CST rows 15. On the other hand, these LLBs 40 can also be configured to simple logic gates, such as NAND or NOR logic circuits; however, they are inefficient compared to such configured logic cells in the CST rows 15. Additionally the LLB rows 16 can be assembled into moderately sized static RAM blocks without using any CST row 15.

Figure 4:
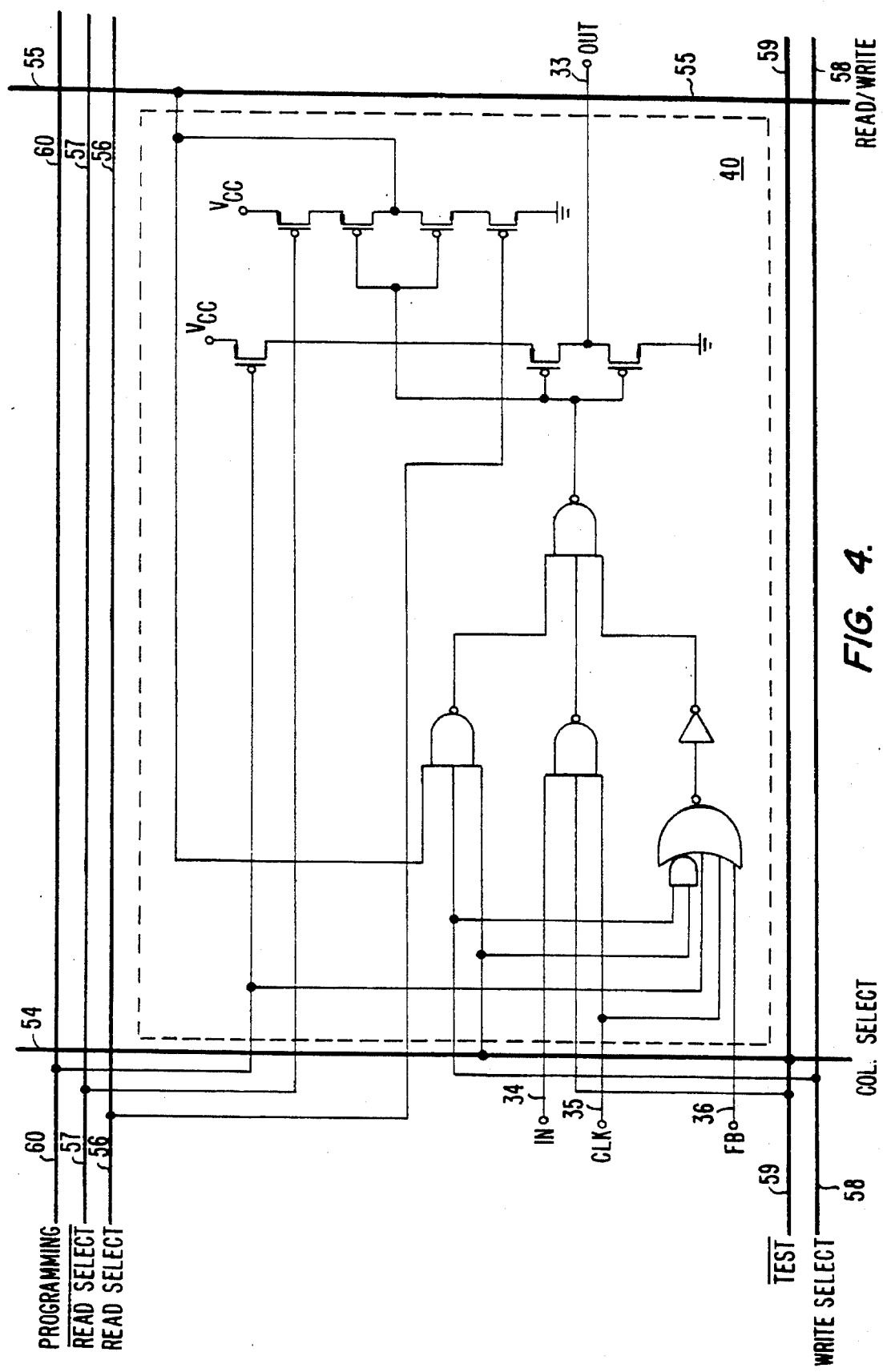
FIG. 4 is a logic circuit schematic of a latch/logic block (LLB) in the core array in FIG. 2.
Figure 5:
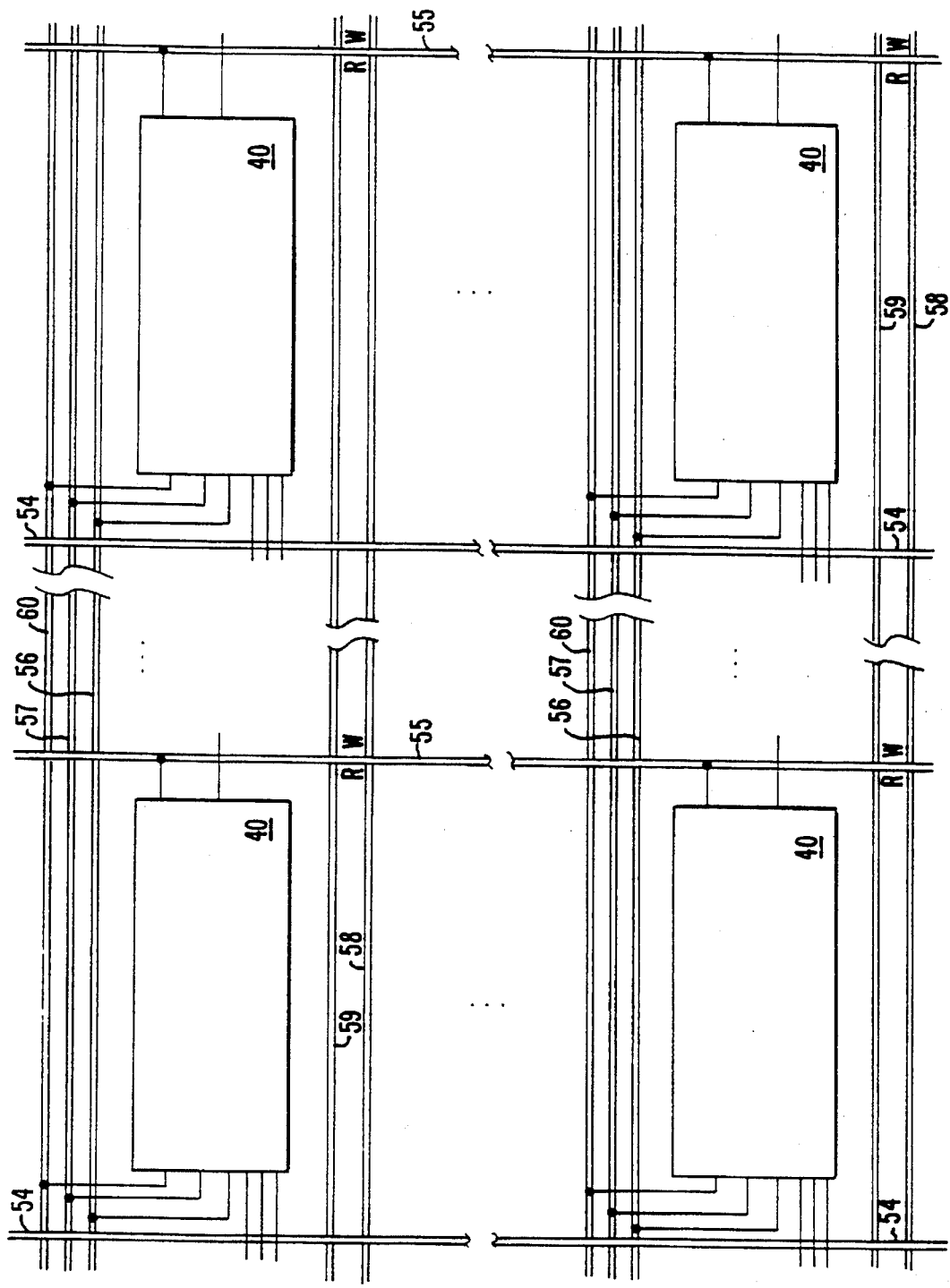
FIG. 5 shows how the LLBs are arranged with respect to each other in the core array.

FIG. 4 is a logic circuit schematic of each latch/logic block (LLB) 40 in an LLB row 16. The LLB 40 shown within the dotted line box is connected to various wiring segments. The LLB 40 is connected to the OUT, IN, CLK, and FB latch segments 33–36 from the CST row 15 directly below and to global horizontal and vertical lines. The horizontal lines are a Read Select line 56, a complementary Ready Select Low line 57, a Write Select line 58, a Test Low line 59 and a Programming line 60. The vertical lines are a Column Select line 54 and a Read/Write (Data) line 55. Associated only with the LLBs 40 and the rows 16, these lines 54–60 organize the LLBs 40 into an array which can be considered separately from the general core array 11. A representation of the LLB 40 array is illustrated in FIG. 5.

Depending upon how the LLBs 40 are configured by the connection of their latch segments 33–36, the individual LLBs 40 serve as various logic cells, which are described above, or as static RAM cells, in which case the lines 54–60 interconnect the RAM cell array for high-speed operation. Examples of different combinations of connections for the latch segments 33–36 to configure different logic blocks and static RAM cells are shown in the patent application, entitled "A Field Programmable Gate Array" and noted above. The particular circuit for the LLB in the patent application is somewhat different from the circuit in FIG. 4, but illustrates the points of the flexibility and the configurability of the LLBs.

Each LLB 40 is four columns wide and has input and output terminals connected to the vertical latch segments 33–36, i.e., CLK, IN, FB, and OUT in FIG. 3. For clocking the LLB 40 at high speed and minimal skew, the CLK segments of the LLBs 40 can be directly connected, i.e., by programming only one antifuse, to the clock lines in the channels 17. Where low-skew, high-performance timing signals are required in a configured cell in a CST row 15, the clock lines can also be directly connected to any P gate segment from the CST row 15. The channel clock lines may also be indirectly connected to any segment in the array.

If the LLBs 40 are configure into static RAM cells, the LLB array becomes a memory array. The Read/Write lines 55 of the array are the bit lines of the RAM array and carry the data signals to and from the memory cells for Write and Read operations. Operating as word lines, the Read Select and Read Select Bar lines 56 and 57 carry the Read operation control signals, and the Write Select lines 58 carry the Write operation control signals. As in any RAM array, a memory cell is selected by the selection of a column of memory cells, i.e., bit line selection, and a row of memory cells, i.e., word line selection.

Programming Circuits

To make the desired connections and program the FPGA, the antifuses are used to configure the logic cells and to make cell-to-cell connections inside the FPGA. As described above, the transistors of the CST rows 15 and LLBs 40 in the LLB rows 16 are connected to wiring segments. These wiring segments intersect with antifuses between the wiring segments at the intersections. Thus selected antifuses are programmed to make the desired electrical connections to configure the wiring segments, CST transistors and LLBs into the desired cells and to make the intercell connections.

Programming Transistors and Programming Grids

To connect two intersecting wiring segments, the two wiring segments must be simultaneously and independently addressed. One wiring segment is driven to the programming voltage $V_{pp}$, +10 volts, and the other wiring segment is driven to the programming voltage $V_{ss}$, 0 volts or ground. The difference between the two programming voltages across the antifuse at the intersection of the two segments programs the antifuse.

In general, every wiring segment in the core array 11 is connected to large transistors for programming purposes. It is desirable that each wiring segment is connected to a PMOS and a NMOS transistor, though bipolar transistors could be used in, say, a BIOS implementation of the FPGA of the present invention. The PMOS programming transistor, connected to a + address circuit, drives the wiring segment to $V_{pp}$ during programming and the NMOS programming transistor, connected to a − address circuit, drives the segment to $V_{ss}$ during programming.

The ability to drive an arbitrary wiring segment to $V_{pp}$ or $V_{ss}$ simplifies the rules and sequence of programming the antifuses of the core array 11 to properly make the many connections required for a user's application. If the wiring segments are constrained to one programming voltage or other, additional complexity is added to the programming rules and sequences. On the other hand, the programming transistors, being large elements, consume much space on the substrate of the integrated circuit. Thus the embodiment described below represents a balance in the number of programming transistors between space conservation and simplicity of programming rules and sequences.

Figures 6A, 6B, 6C:
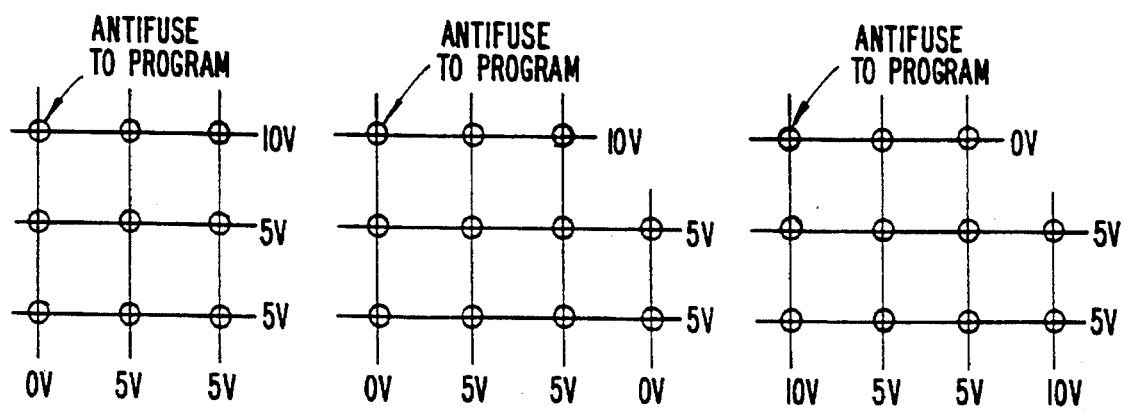
FIGS. 6A to 6C show representationally different combinations of programming voltages in a grid of wiring segments.

The +, or $V_{pp}$, address circuit, and the −, or $V_{ss}$, address circuit are two independent circuits. Through the + address circuit and PMOS programming transistor, a + addressed wiring segment is driven to $V_{pp}$ by a connection to a $V_{pp}$ pin (which is held at +10 volts during programming) of the FPGA integrated circuit during programming. Through the − address circuit and NMOS programming transistor, the − addressed wiring segment is driven to $V_{ss}$ by a connection to a $V_{ss}$ pin (which is held at ground during programming). The nonaddressed wiring segments are left at a precharge voltage of +5 volts, intermediate between $V_{pp}$ and $V_{ss}$. FIGS. 6A–6B illustrate this with a representational grid of wiring segments and antifuses.

Figure 7:
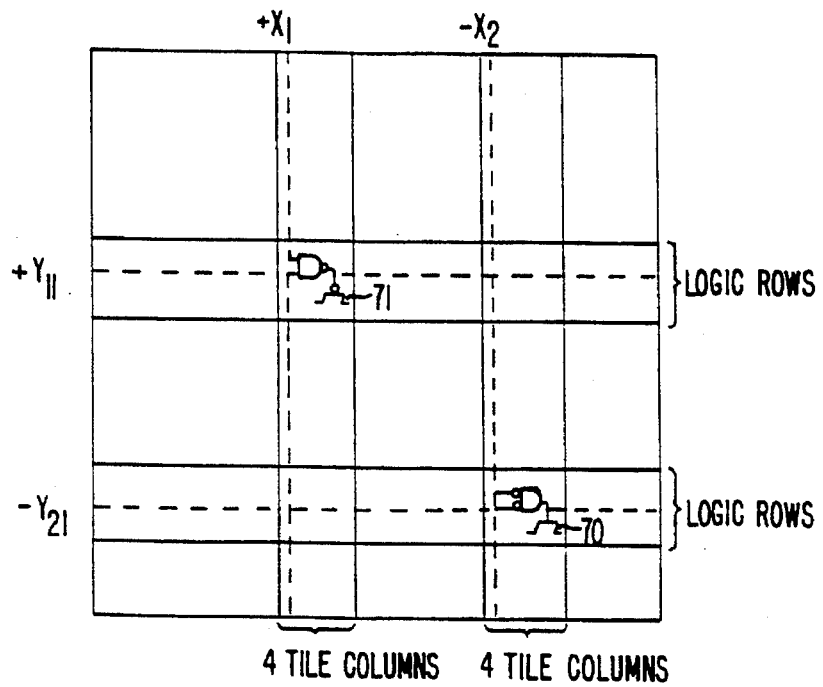
FIG. 7 shows representationally X, Y addressing of wiring segments in the core array.

Each of the + and − programming address circuits are separated into two parts. One part of the programming address circuits decodes address signals down to a bank of programming transistors connected to the wiring segments in a four-tile group in a CST row 15. Thus these address signals, represented by +X, +Y for the + address circuit and −X, −Y for the − address circuit, select a bank of PMOS programming transistors (and their wiring segments) for the $V_{pp}$ programming voltage and a bank of NMOS programing transistors (and their wiring segments) for the $V_{ss}$ programming voltage. This is illustrated representationally by FIG. 7. The selection of the particular PMOS programming transistor from those selected by the +X, +Y address signals and NMOS programming transistor from those selected by the −X, −Y address signals is performed by the second part of the programming address circuits which connects only one of the PMOS programming transistors to $V_{pp}$ and only one of the NMOS transistors to $V_{ss}$.

Figure 8:
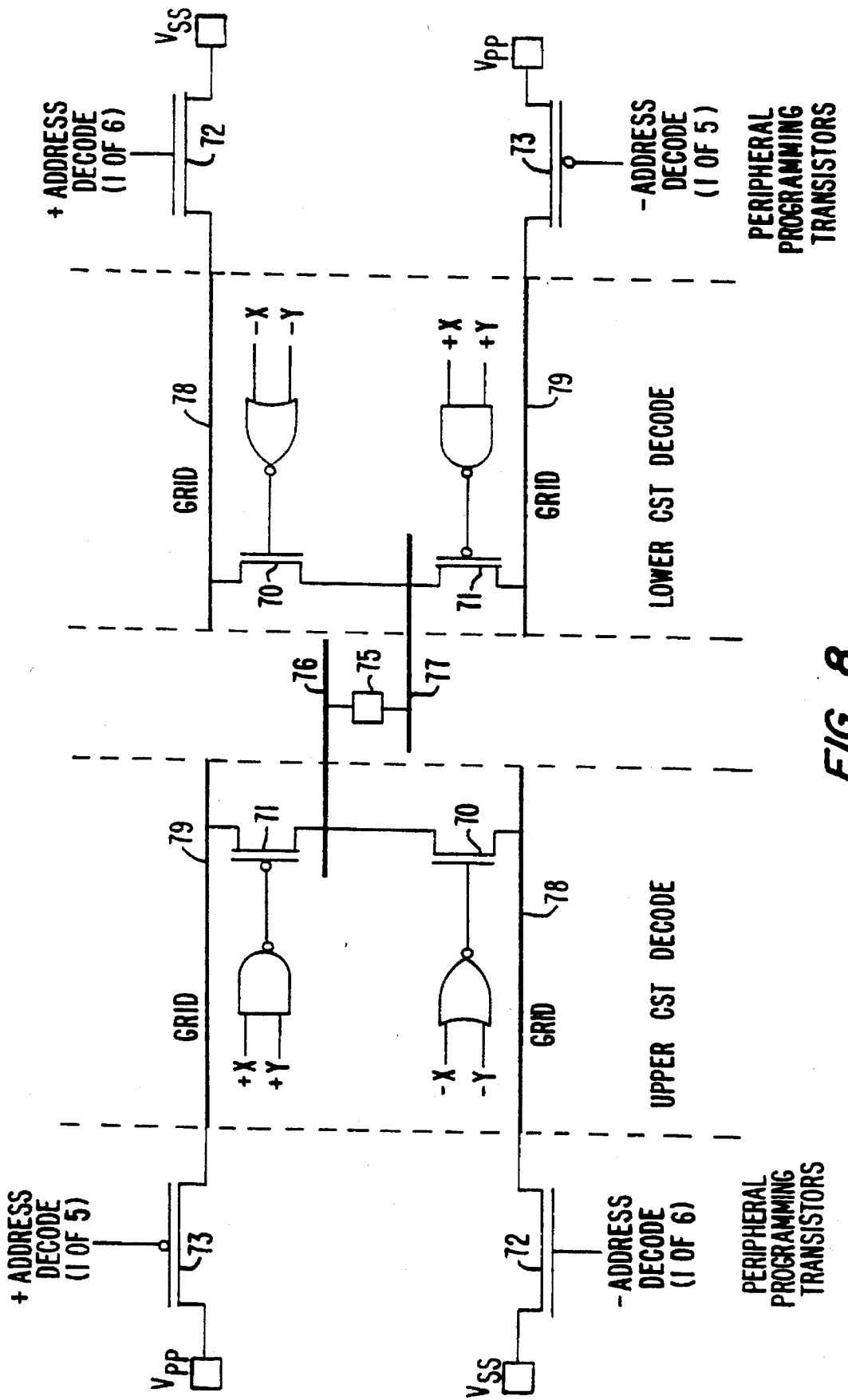
FIG. 8 illustrates the general arrangement of the programming circuits for each wiring segment in the core array of the FPGA.

As illustrated in an generalized form in FIG. 8, each wiring segment 76 and 77 is connected to a PMOS programming transistor 71 and a NMOS programming transistor 70. The + and − address decoding occurs on both the sources and gates of the programming transistors. For PMOS programming transistors, +X, +Y address signals are decoded for the gates. For NMOS programming transistors, −X, −Y address signals are decoded for their gates. For the + and − address decoding on the sources of the programming transistors, the source node of each PMOS programming transistor 71 is connected to one of the + programming grids 79. Likewise, the source node of the NMOS programming transistor 70 is connected to one of the − programming grids 78.

Each programming grid 78, 79 is formed from metal lines which run horizontally in every CST row 15. Each grid is regularly cross-connected vertically. Grids are used, rather than only horizontal lines, to minimize the effective metal resistance between the source node of any programming transistor and the edge of the array 11 where the grids are connected to the $V_{pp}$ and $V_{ss}$ programming voltages. In this manner sufficient power can be delivered to any antifuse in the array 11 to program the antifuse.

The programming grids are not connected directly to the $V_{pp}$ and $V_{ss}$ power pins on the integrated circuit. Between the grids and the pins are many large transistors distributed around the periphery of the array 11. These peripheral programming transistors, represented by transistors 72 and 73 in FIG. 8, are connected such that during the programming of an antifuse, represented by an antifuse 75 in FIG. 8, only one + programming grid 79 is driven to $V_{pp}$ and only one − programming grid 78 is driven to $V_{ss}$.

The remaining programming grids are left at an intermediate voltage $V_{pr}$, +Y25 volts, which is obtained by a precharge operation prior to the programming of the selected antifuse. In the precharge operation, all of the + and − programming grids are set to +5 volts and all of the programming transistors are turned on and then turned off. All of the wiring segments are then left floating at +5 volts.

As mentioned above, the +X, +Y and −X,−Y signals address the gates of the programming transistors 70 and 71, one of which is connected to the desired wiring segment. The desired wiring segment is selected by the selection of the grid which is connected to the programming transistor connected to the desired segment. The +X, +Y and −X,−Y addressing selects a bank of PMOS or NMOS programming transistors shown representationally in FIG. 7. The +X, +Y and −X,−Y addressing is used to select a four-tile group of wiring segments and their programming transistors within one CST row 15. This +X, +Y and −X,−Y addressing is such that every four-tile column of the array 11 has one +X programming control line and one −X programming control line and every row 15 has four +Y programming control lines and four −Y programming control lines. The four pairs of +X, +Y1 programming control lines, +X, +Y2 programming control lines, +X,+Y3 programming control lines, and +X,+Y4 programming control lines are each NANDed together to each produce local + programming control signals for row Y and four-tile column X. Each local + programming control signal is sent to the gates of the bank of PMOS programming transistors, of which one has a source node connected to a + programming grid which is driven to $V_{pp}$ during programming.

Likewise, the pairs of −X,−Y1 programming control lines, −X,−Y2 programming control lines, −X,−Y3 programming control lines, and −X,−Y4 programming control lines are each NORed together to each produce local − programming control signals for the row Y and the four-tile column X. Each local − control signal is sent to the gate electrodes of a bank of NMOS programming transistors, of which one has a source node connected to a + programming grid which is driven to $V_{ss}$ during programming.

The present embodiment has five + programming grids and six − programming grids. Each NAND logic function of +X,+Y1, +X,+Y2, +X,+Y3 and +X, +Y4 produces five + programming control signals to the gate electrodes of a bank of five PMOS programming transistors and each NOR logic function of–X,–Y1, –X,–Y2, –X,–Y3 and –X,–Y4 produces six − programming control signals to the gate electrodes of a bank of six NMOS programming transistors. FIG. 9 is a table which shows the connections for each wiring segment in a four-tile group of wiring segments to its programming grid and its ±Y control line for a given ±X address. Each P gate, P SD wiring segment and latch segments (IN, CLKB, OUT and FB) is connected to a NMOS programming transistor, but not a PMOS programming transistor. Conversely, each N gate and N SD wiring segment is connected to a PMOS programming transistor, but not a NMOS transistor. Thus the table in FIG. 9 indicates 20 PMOS programming transistors and 24 NMOS programming transistors for each four-tile group.

In fact, there are only 16 NMOS programming transistors. The 8 NMOS transistors connected to the wiring track segments T1–T8 in the channels 17 are small test transistors described below. These transistors are not used for programming. Track segments T1–T8 are programmed by PMOS programming transistors.

If substrate space is of less concern, more programming grids and transistors may be added. In the patent application described above, each wiring segment of a four-tile group is connected to a PMOS and a NMOS programming transistor. Eight + programming grids and eight − programming grids and each ±X, ±Y NOR and NAND logic function is connected to a bank of eight programming transistors. The result is 32 PMOS programming transistors and 32 NMOS programming transistors for each four-tile group.

As shown in FIG. 3, the decoding logic gates and programming transistors are broken into an Upper Decode Logic block 80 and a Lower Decode Logic block 81 in the four-tile group. The Upper and Lower Decode Logic blocks 80 and 81 contain the programming transistors, represented by the transistors 70 and 71 of FIG. 8, and the wiring from the blocks 80 and 81 are the connections from the programming transistors 70 and 71 to the wiring segments of the tiles in a CST row 15. The Decode Logic Blocks 80 and 81 also contain the eight horizontal +Y1 to +Y4 and −Y1 to −Y4 programming control lines. The vertical +X and −X address lines are not shown. This structure repeats every four tiles across each CST row 15 in the array 11. The horizontal + and − programming grids are represented by the Grid Blocks 82.

The Upper Decode Logic block 80 handles the programming voltages of the wiring segments in the upper portion of the four-tile group. The wiring segments include latch segments to the LLB 40 above (and the horizontal wiring tracks T1–T8 in the channel 17 above for testing). The Lower Decode Logic block 81 handles the programming voltages for the wiring segments in the lower half of the four-tile group. The wiring segments also include the horizontal wiring tracks T1–T8 in the channel 17 below the CST row 15. Thus the horizontal wiring tracks (T1–T8) in the N channel programming table are not the same horizontal wiring tracks (T1–T8) in the P channel programming table in FIG. 9.

FIG. 3 also illustrates the distribution of the programming functions between the core array 11 and the periphery 14 of the FPGA to minimize the space occupied by the programming address circuits. At the periphery of the integrated circuit, the peripheral programming transistors decode the addresses for the selected + and − programming grids. The remainder of the decoding is performed by the Decode Logic Blocks 80, 81 in the CST rows 15. Of course, the programming address circuits may be organized differently depending upon different constraints of the particular FPGA being designed.

CST Row Isolation Circuits

Besides the programming circuits discussed above, the gates of the transistors in the CST rows 15 are connected to CST row isolation circuits. These circuits are used to ensure the turn off of PMOS and NMOS transistors in the CST rows 15 to prevent spurious current paths during programming of the antifuses. Ideally, besides the intermediate voltage precharge operation described previously, the gate electrodes of the PMOS and NMOS transistors in the CST rows 15 could be precharged to a high voltage in one direction or another, i.e., $V_{pp}$ and $V_{ss}$, during programming to ensure turn off of the transistors. However, process deficiencies leading to leakage currents may render ideal operation problematical. The isolation circuits described below ensure isolation by the selected transistor(s) in the CST rows 15 during programming.

Figure 10:
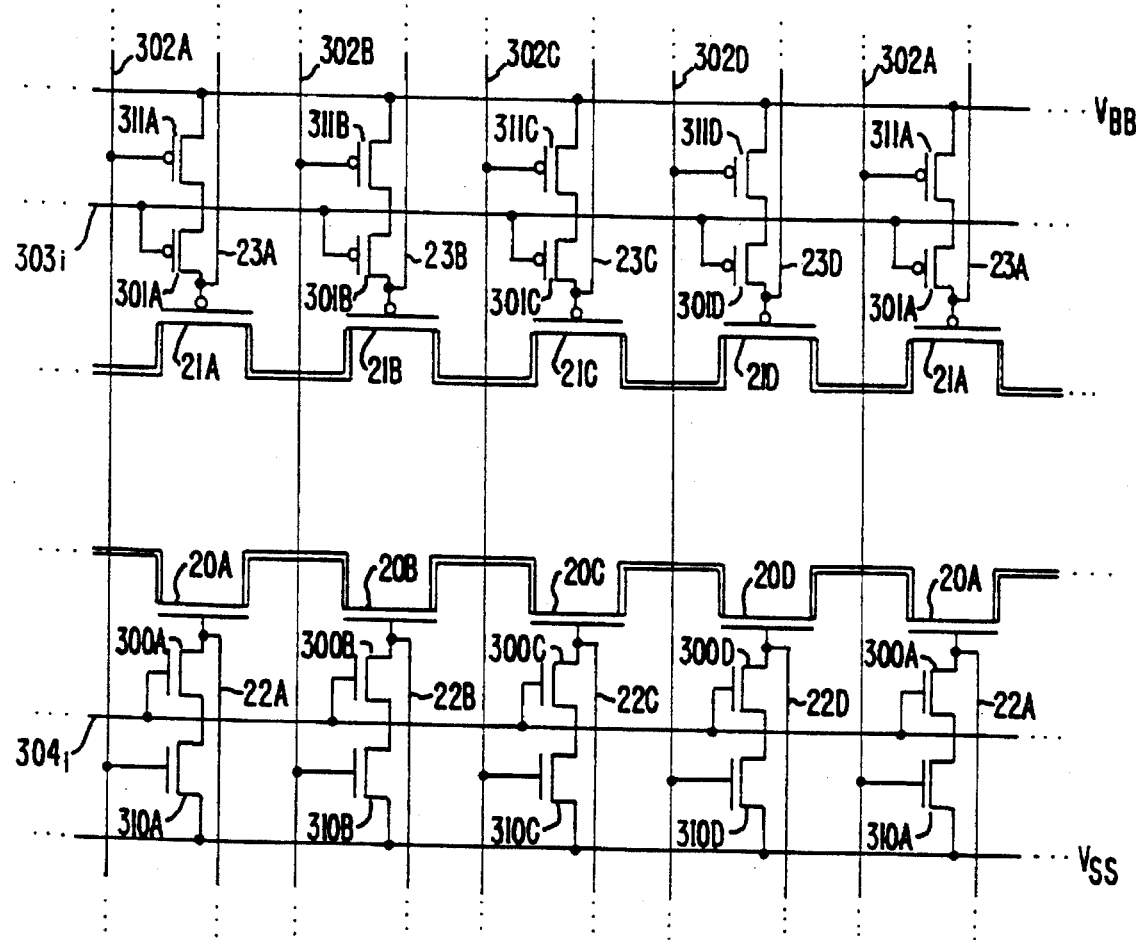
FIG. 10 details the isolation transistor circuitry for the transistors in the CST rows in the core array.

Besides the gate wiring segments 23A–23D discussed previously with respect to FIG. 3, each gate of each PMOS transistor 21A–21D (in a repeating cycle of four-tile group in a CST row 15) is also connected to a $V_{pb}$ pin through two series-connected PMOS transistors 301A–301D and 311A–311D, as shown in FIG. 10. The $V_{pb}$ pin provides another high positive voltage supply during programming. The first PMOS transistor 301A–301D has a drain connected to the gate of its respective transistor 21A–21D, a gate connected to a row P gate isolation control line 302i (i representing an arbitrary ith row) and a source connected to the drain of a second PMOS transistor 311A–311D respectively. The second PMOS transistor 311A–311D has a gate connected to a corresponding column isolation control line 302A–302D and a source connected to the $V_{pb}$ pin. When both PMOS transistors 301A–301D and 311A–311D are enabled, the gate of the PMOS transistor 21A–21D in the CST row 15 is at $V_{pb}$, +10 volts during programming, and the transistor 21A–21D is turned off. No current can flow through the transistor.

In a similar fashion each gate of the NMOS transistors 20A–20D in the CST rows 15 is also connected to the CST row isolation circuits. The gate of each NMOS transistor 20A–20D is connected to the drain of a first NMOS transistor 300A–300D respectively. The NMOS transistor 300A–300D has its gate connected to a row N gate isolation control line 304i and a source connected to the drain of a second NMOS transistor 310A–310D respectively. The second NMOS transistor 310A–310D has a gate connected to the corresponding column gate isolation control line 302A–302D and a source connected to the $V_{ss}$ pin.

The column isolation control lines 302A–302D, the row N gate isolation control lines 303i and the row N gate isolation control lines 304i are connected to decoding circuits which enable and disable the transistors 301A–301D, 300A–300D, 311A–311D and 310A–310D. A signal on each of the column isolation control lines 302A–302D enables either the PMOS transistors 311A–311D or the NMOS transistors 310A–310D in each column of the core array 11. A signal on each of the row P gate isolation control lines 303i enables the PMOS transistors 301A–301D in the ith row of the array. A signal on each of the row N gate isolation control lines 304i enables the NMOS transistors 300A–300D in the ith row of the array. By sending signals on these column and row control lines, the transistor at the intersection in the CST row 15 is turned off to ensure isolation.

Programming Rules and Sequences

To program the FPGA, antifuses are programmed to connect the CST transistors and LLB's into configured cells and to connect the cells to make the desired digital logic circuit. The rules and sequences for programming the antifuses are beyond the scope of the present invention, but are disclosed in U.S. Ser. No. 07/671,222 noted above.

Input/Output Section

Figure 11:
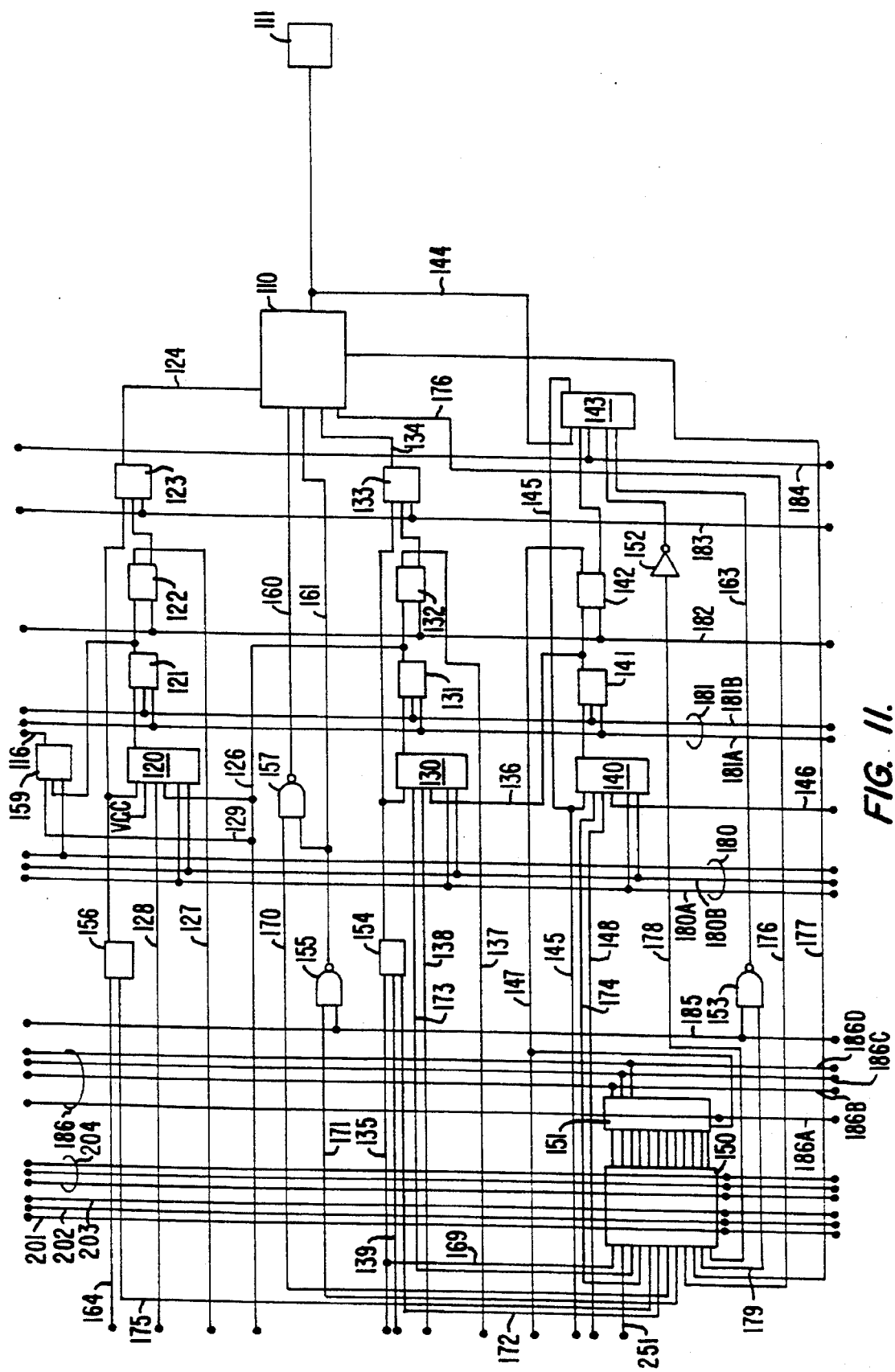
FIG. 11 is a logic circuit schematic of an input/output buffer circuit if the I/O section in FIG. 1.
Figure 12:
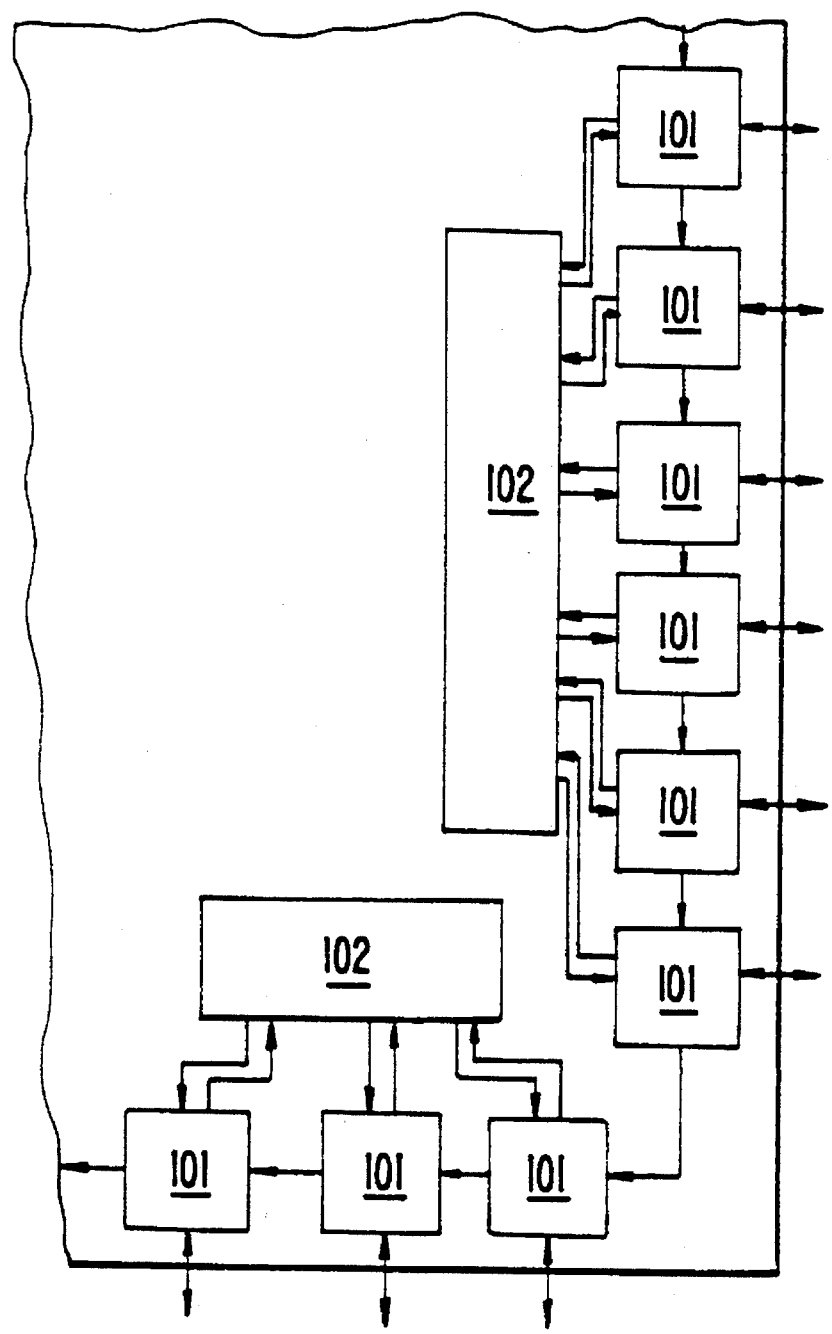
FIG. 12 illustrates the general connection between the input/output buffer circuits of the I/O section and the core array of FIG. 1.

The input/output section 14 of the FPGA integrated circuit comprises a plurality of input/output buffer circuits 101, a circuit diagram of which is shown in FIG. 11, around the periphery of the semiconductor substrate 10 as illustrated in FIG. 12. The circuit 101 is described in detail for an understanding of the testing operations according to the present invention. Other aspects of a very similar input/output buffer circuit and its operation are described in U.S. Ser. No. 07/718,667, entitled, "PROGRAMMABLE INPUT/OUTPUT BUFFER CIRCUIT WITH TEST CAPABILITY," filed Jun. 21, 1991 by Christopher E. Phillips et al., and assigned to the present assignee.

Each input/output buffer circuit 101 can act as an output buffer to transmit data signals from the rest (interior) of the integrated circuit to the outside environment and as an input buffer to transmit data signals from the outside environment to the core array 11 of the FPGA through intermediate circuits in the peripheral control section 13. Such circuits in the control section 13 are well within the understanding of integrated circuit designers.

The input/output buffer circuit also operates under the IEEE standard 1149.1. As shown representationally by the arrows between the buffer circuits 101 in FIG. 12, the buffer circuits in this mode of operation transmit signals between each other in a serial scan chain. These serial scan chain signals are test data signals under the IEEE 1149.1 test standard. In the FPGA of the present invention, the signals are also used for programming the integrated circuit.

The buffer circuit 101, as shown in FIG. 11, is generally organized with a programming unit 150 and a decoder 151 to program the unit 150, an output driver stage 110, and three cells, which are combinations of a multiplexer, a flip-flop, a latch and a second multiplexer.

The programming unit 150 contains antifuses which are programmed to set various control lines emanating from the unit 150. The programming unit 150 can be used to set the operational characteristics of the output signals from the input/output buffer circuit and to handle different operational characteristics of the input signals to the input/output buffer circuit. Once programmed, the unit 150 sets control signals to select the output mode operation of the circuit 101, the output drive current and slew rate, the enablement of output data signals from the core array 11, the operation of the multiplexer 143, and the output state of the unasserted output stage 110. The unit 150 can also store information which may be read through the multiplexers 130 and 140, and can set the signal level on certain wiring segments and lines in the core array 11.

The control lines from the programming unit 150 include a control line 175 connected to an enable terminal of a latch 156, which receives a Data Out Enable signal from the core array 11 on a line 164. The latch 156 has a second enable terminal which is set permanently to a logic "1", $V_{cc}$, so that the latch 156 is enabled only by the control signal on the line 175. The output terminal of the latch 156 is connected to an input terminal of the multiplexer 123 which has its output terminal connected to an enable terminal of the output driver stage 110 by a line 124. When enabled, the output driver stage 110 transmits the signal on the line 134 from the multiplexer 133 to the terminal 111.

When disabled, the stage 110 is placed in a state of high impedance. Furthermore, responsive to the setting of the control line 177, the output driver stage 110 can be set in an "open source" or "open drain" mode, i.e., either logic high/high impedance or logic low/high impedance.

Outgoing data signals are carried on a Data Out line 135 from the core array 11. The line 135 is connected to an input terminal of a latch 154 which has two enable terminals, both of which must be high to enable the latch 154. The first terminal is connected to a control line 172 from the programming unit 150. The second terminal is connected to a line 139 from the core array 11. These two lines 172 and 139 allow the latch 154 and the Data Out function to be tested.

The latching of both the Data Out signals and the Data Out Enable signals may be timed. As explained below, the control lines 172 and 175 may be programmed to be connected to clock lines 204 which run through the programming unit 150.

In its output operation, the output driver stage 110 transmits signals on the line 134 from a multiplexer 133 to the input/output terminal 111, an input/output bonding pad of the integrated circuit. Depending upon the selection by the multiplexer 133, the signal on the line 134 could be a data signal on the Data Out line 135 through the latch 154 or a signal from a latch 132. A control signal on a line 170 through a NAND gate 157 sets a signal on a line 160 to the output stage 110 so that the output drive current is set at a particular value. A control signal on a line 171 through a NAND gate 155 generates a control signal on a line 161 so that the output stage 110 generates a higher output current. An even larger output current is also possible with a combination of control signals. The programming unit 150 also controls the slew rate of the output driver stage 110 by a control line 176.

The cells of the buffer circuit 101 are arranged to handle signals under the IEEE 1149.1 standard and signals for input and output operations. The first cell of the buffer circuit 101, a multiplexer-flip-flop-latch-multiplexer combination, has a 4-to-1 multiplexer 120 which has its output terminal connected to an input terminal of a flip-flop 121. The output terminal of the flip-flop 121 is connected to an input terminal of a latch 122 which, in turn, has its output terminal connected to an input terminal of the 2-to-1 multiplexer 123. The output terminal of the multiplexer 123 is connected by the line 124 to an input terminal of the output stage 110.

The four input terminals of the multiplexer 120 are connected to the line 164, a logic "1" state generator, here the voltage supply at $V_{cc}$, a line 128 which is connected to a node in the interior of the integrated circuit, and a line 126 connected to an output terminal of a latch 131 belonging to the second cell, the multiplexer-flip-flop-latch-multiplexer combination described below. The multiplexer 120 is also connected to control lines 180A and 180B (two of three Select Data Register control lines), which determine which of the four input terminals is selected.

The flip-flop 121 is connected to two clocked control lines 181A and 181B (Clock Data control lines), which normally operate in complementary fashion. As described later, the clocked control lines 181A and 181B can also operate in other modes including a pass-through mode by which signals pass directly from the input terminals to the output terminals of the flip-flops 121. Besides the input terminal of the latch 122, the output terminal of the flip-flop 121 is connected to an input terminal of a 2-to-1 multiplexer 159. The latch 122 is also connected a control line 182 (Update Register control line).

Besides the output terminal of the latch 122, the 2-to-1 multiplexer 123 of the first combination is connected to an output terminal of the latch 156 and a control line 183 (Output Mode control line) over which selection signals are transmitted.

Similarly, the second cell has a 4-to-1 multiplexer 130 which has its output terminal connected to an input terminal of the flip-flop 131. The output terminal of the flip-flop 131 is connected to a second input terminal of the multiplexer 159 by a line 129 and to an input terminal of a latch 132 which, in turn, has an output terminal connected to an input terminal of a 2-to-1 multiplexer 133. The output terminal of the multiplexer 133 is connected by the line 134 to an input terminal of the output stage 110.

The four input terminals of the multiplexer 130 are connected to an output terminal of the latch 154, the control line 173, a line 138 connected to a node in the interior of the integrated circuit, and a line 136 connected to the output terminal of a flip-flop 141 belonging to the third combination. Like the multiplexer 120, the multiplexer 130 is connected to the control lines 180A and 180B.

The flip-flop 131 is connected to the control lines 181A and 181B like the flip-flop 121 of the first combination. Similarly, the latch 132 is connected to the control line 182, like the latch 122 and the 2-to-1 multiplexer 133. The multiplexer 133 is also connected to the output terminal of the latch 154 and to the control line 183, like the multiplexer 123.

The third cell is somewhat different from the other two cells. Like the other multiplexers of the first two cells, a 4-to-1 multiplexer 140 of the third cell has its output terminal connected to a flip-flop 141 which has its output terminal connected to an input terminal of a latch 142. An output terminal of the latch 142 is connected to an input terminal of a programmable 2-to-1 multiplexer 143.

The four input terminals of the multiplexer 140 are connected to a data input line 145 leading to the system logic of the integrated circuit, the control line 174 from the programming unit 150, a line 148 from a node in the interior of the integrated circuit, and a line 146. As in the case of the multiplexers 120 and 130, the multiplexer 140 is connected to the control lines 180A and 180B for selection of input terminals. Similarly the flip-flop 141 is connected to the control lines 181A and 181B, and the latch 142 is connected to the control line 182.

The multiplexer 143 differs from the multiplexers 123 and 133. The output terminal of the multiplexer 143 is connected, not to the output driver stage 110, but rather to the interior of the integrated circuit by the line 145. One input terminal of the multiplexer 143 is connected to the output terminal of the latch 142, but the second input terminal is connected to the input/output terminal 111 by a line 144. The multiplexer 143 is connected to a control line 184 (Input Mode control line) which carries signals to put multiplexer 143 into a high impedance condition. The multiplexer 143 is also connected to the control lines 162 and 163. Signals on the control line 162 through an inverter 152 determine whether the input terminal connected to the terminal 111 or the input terminal connected to the latch 142 is selected. If the terminal 111 is selected, the control signals on the line 163 determine whether the multiplexer 143 operates at TTL (Transistor-Transistor Logic) levels or at CMOS (Complementary Metal-Oxide-Semiconductor) transistor levels.

The control lines 180 (180A–180C), 181 (181A–181B), 182, 183, 184 and 185 carry signals from control logic in the integrated circuit. Such logic may be designed by a person skilled in integrated circuit design to operate with the present invention as described above and according to the requirements of the particular integrated circuit. However, the present invention is also being described in the context of the IEEE 1149.1 standard. Thus the control logic is constrained by the specifications of the standard.

The buffer circuit 101 is generally replicated for each input/output terminal. The input buffer circuits are connected in common to the previously mentioned control lines 180–185. Furthermore, the line 146, which is connected to an input terminal of the multiplexer 140, of one input/output buffer circuit is connected to the corresponding line 116 of a neighboring input/output buffer circuit. Likewise, the line 116 of the first input/output buffer circuit is connected to the corresponding line 146 of a second neighboring input/output buffer circuit. These connections between input/output buffer circuits 101 are shown in FIG. 12.

During operation, signals are transferred through the input/output buffer circuit of FIG. 12 in many ways. For incoming data signals, the data signal from the terminal 111 travels through the line 144 to the multiplexer 143. With an input mode selected by a control signal on the line 184, the data signal passes through the multiplexer 143 through the line 145 and to the rest of the integrated circuit. Output data signals travel from the interior of the integrated circuit on the Line 135 to the latch 154, which is docked by signals on a line 139. The output data signals from the latch 154 are passed to the multiplexer 133, which by an output mode selection signal on the control line 183 sends the output data signals to the output driver stage 110. It should be noted that the latch 154 can be set to hold or pass the data signals by a signal on the control line 172 from the programming unit 150.

Signals can also move through the input/output buffer circuit in the IEEE standard 1149.1 test mode. In this mode, test data signals travel to the line 146 (TDI in the terminology of the 1149.1 standard) from the corresponding line 116 (TDO in the terminology of the 1149.1 standard) of a neighboring input/output buffer circuit. The test data can be serially scanned through each input/output buffer circuit by the movement of data through the multiplexer 140, the flip-flop 141, and the line 136 to the multiplexer 130. Then the data continues through the flip-flop 131 and line 126 to the multiplexer 120. From the multiplexer 120 the data travels through the flip-flop 121 and the multiplexer 159 to the next input/output buffer circuit on the line 116.

For a test of the integrated circuit the test data are scanned in serially as described, sent into the system logic of the integrated circuit on the line 145 of each input/output buffer circuit, processed by the integrated circuit, and read out on the line 138 of each input/buffer circuit. The processed test data are then scanned out serially and compared with expected test data. All of these operations are described in the specification of the IEEE 1149.1 standard. Beyond these 1149.1 testing procedures, the present invention contemplates further test operations which are described below.

Signals can be serially scanned through the input/output buffer circuits for purposes other than test. For example, control signals may be moved along the serial scan path described above until the each control signal is in the flip-flops 121, 131, and 141 of each input/output buffer circuit 101. Then the latches 122, 132 and 142 are enabled to respectively transmit the signals on the lines 127, 137 and 147 to the core array 11. These control signals, the +X,+Y and −X,−Y address signals, are received by decoding logic which address the wiring segments and, in turn, the intersecting programmable elements, in the array for programming.

It should be noted that signals, data or otherwise, may be received by the input/output buffer circuit from the terminal 111, through the multiplexer 143 and line 145. From the line 145, the signals are received by the multiplexer 140 and stored in the flip-flop 141. From here the signals may be serially scanned as described for the test data signals.

The input/output buffer circuit may also receive signals in other ways. The lines 128, 138 and 148 are connected to various nodes in the system logic of the integrated circuit. By appropriate signals on the control lines 180A and 180B, the logic states at these nodes are read out through the multiplexers 120, 130 and 140. These signals may then be scanned out serially as described for the IEEE standard test data or read out sequentially through the flip-flop 131, latch 132, multiplexer 133 and output stage 110 of each of the input/output buffer circuits. One skilled in the field of integrated circuit design should readily appreciate the benefits of such direct access to the core array 11.

The multiplexers 130 and 140 also have one of their input terminals connected to the programming unit 150 by the lines 173 and 174. Upon the proper signals on the control lines 180, bits of information stored in the programming unit 150 are respectively loaded into the flip-flops 131 and 141. At the same time a logic "1" from the input terminal of the multiplexer 120 connected to the $V_{cc}$ power supply is loaded into the flip-flop 121. The two storage locations in the programming unit 150 are part of registers which are defined in the IEEE test specification. Each input/output buffer circuit contains a two-bit portion of registers including the Identification Code Register, User Code Register, and User Test Register. Furthermore, the two storage locations may be used for other registers, such as a manufacturing code register.

The programming unit 150 is also connected to the core array 11 by a control line 251. Depending upon the location of the input/output buffer circuit 101, the line 251 may be connected to wiring segments in the core array 11 to tie off the segments electrically by setting the line 251 logic high or low. The line 251 may also be connected to one of the R/W Data lines 55 which are connected to the array of LLB's 40. By setting the line 251 logic high or low, the LLB's 40 connected to the line 251 are configured for memory or logic operation.

Programming of the input/output buffer circuit is performed through the decoder 151 which addresses the particular programmable elements in the unit 150. From the four control lines 186 (186A–186D), the decoder 151 performs a 1-of-12 selection for programming the unit 150. The control lines 186, which pass globally through all of the input/output buffer circuits 101, emanate from a control register is loaded serially with the programming information. Selection of the particular input/output buffer circuit 101 is performed with 1149.1 serial scan chain. An enabling signal is serially scanned into the flip-flop 141 of the particular circuit 101 to be programmed. By a signal on the control line 182, the enabling signal is captured in the latch 142. From an output terminal of the latch 142, the signal is carried by the line 147 to an enabling input terminal of the decoder 151.

Figure 13:
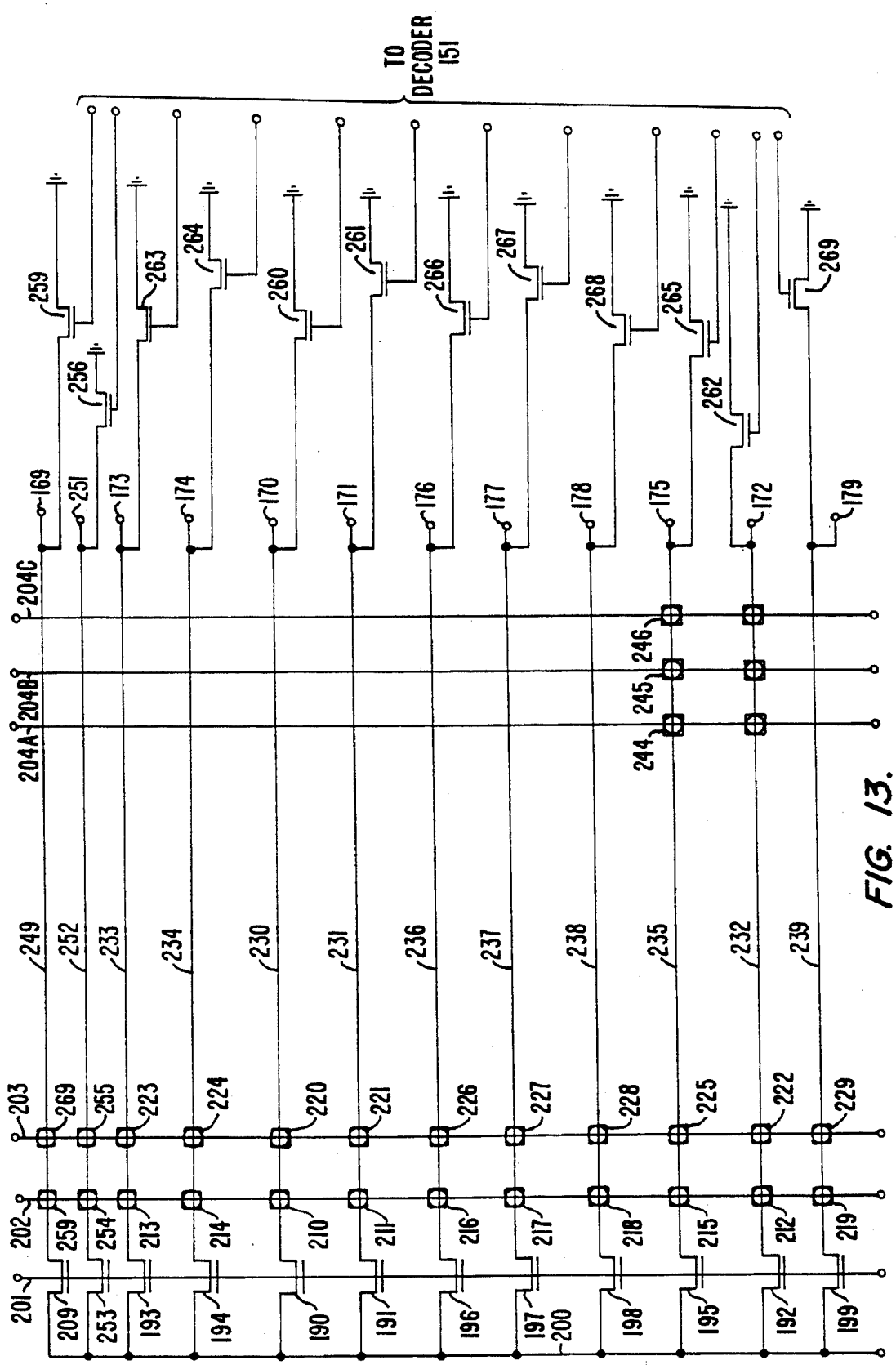
FIG. 13 is a logic circuit schematic of a programming unit in the input/output buffer circuit of FIG. 11.

FIG. 13 illustrates the details of the programming unit 150. The output terminals of the unit 150 are labeled with the reference numbers of the control lines 169–179 and 251 to which each of the output terminals are connected as shown in FIG. 11. Each of the output terminals 169–179 and 251 are respectively connected to one of several programming lines 230–239, 249 and 252. Each of the lines 230–239, 249 and 252 are connected to the source/drains of NMOS transistors 260–269, 259 and 256 respectively. The other source/drains of the transistors are connected to ground. The gates of the transistors are connected to 12 address lines from the decoder 151. Each of the lines 230–239, 249 and 252 are also connected to the source/drains of NMOS transistors 190–199, 209 and 253 respectively, which have their other source/drains connected to a precharge programming line 200. The gates of each of the transistors 190–199, 209 and 253 are commonly connected to a precharge control line 201.

Intersecting each of the lines 230–239, 249 and 252 are two control lines 202, 203 and three clock lines 204A–204C. At the intersection of each programming line 230–239, 249 and 252 and the control line 202 are antifuses 210–219, 259 and 254. The antifuses 220–229, 269 and 255 are located at the intersection of each programming line 230–239, 249 and 252 and the control line 203. The programming line 232 also has antifuses 241–243 at its intersection with the clock lines 204A–204C and the programming line 235 has antifuses 244–246 at its intersection with the clock lines 204A–204C.

Programming of the unit 150 is performed by connecting the 230–239, 249 and 252 (and the terminals 170–179, 169 and 251 and their control lines) to the control line 202, which is normally in a logic high state, to the control line 203, which is normally in a logic low state, and to the clock lines 204A–204C, which carry different timing signals. Connection is made by programming the antifuse at the intersection between the conducting line and the control or clock line.

Antifuse programming is performed by first placing all the programming lines 230–239, 249 and 252 into a precharge state. Through a signal on the control line 201, all the transistors 190–199, 209 and 253 are turned on to connect the lines 230–239, 249 and 252 to the precharge control line 200. The line 200, at +5 volts, charges all the lines 230–239, 249 and 252 to this voltage. Then the transistors 190–199, 209 and 253 are turned off.

To program a selected antifuse, say, the antifuse 227, a large voltage, 10 volts in this case, is placed across the targeted antifuse. Through the operation of the decoder 151 the transistor 187 is turned on to ground the line 237. At the same time, through other decoder circuitry the control line 203 is raised to a special programming voltage of +10 volts. (The decoder circuitry and circuits for generating the programming voltage are not shown in the drawings. One skilled in the integrated circuit design would know to design decoder and programming voltage circuits.) With 10 volts across the antifuse 227, the antifuse is programmed and the line 237 is connected to the control line 203 in the low logic state. With the other lines 230–236, 238–239, 249 and 252 precharged to an intermediate voltage of +5 volts, the antifuses at the intersections of these lines do not experience the large programming voltage of 10 volts and hence remain unprogrammed. In this manner the control lines 230–239, 249 and 252 are set to a high logic state, i.e., connection to the control line 202, or to a low logic state, i.e., connection to the control line 203.

The conducting lines 232 and 235 may also be connected to the clock signal lines 204A–204C by programming the antifuses 241–246. These antifuses are programmed in same manner as described above. In this case, however, the clock lines 204A–204C are raised to the programming voltage.

Thus the programming unit 150 can set the operation of the input/output buffer circuit 101. For example, the control line 169 can be set low by programming the antifuse 269. By programming one of the antifuses 244–246, the control line 175 carries a clock signal so that the output driver stage 110 is periodically enabled. The terminal 111 is periodically pulled low; otherwise the terminal 111 is part of an open circuit. Note that the output driver stage 110 can be completely enabled or disabled by programming the antifuses 215 or 225 to set the control line 175 high or low.

Clock Grids

Figure 14A:
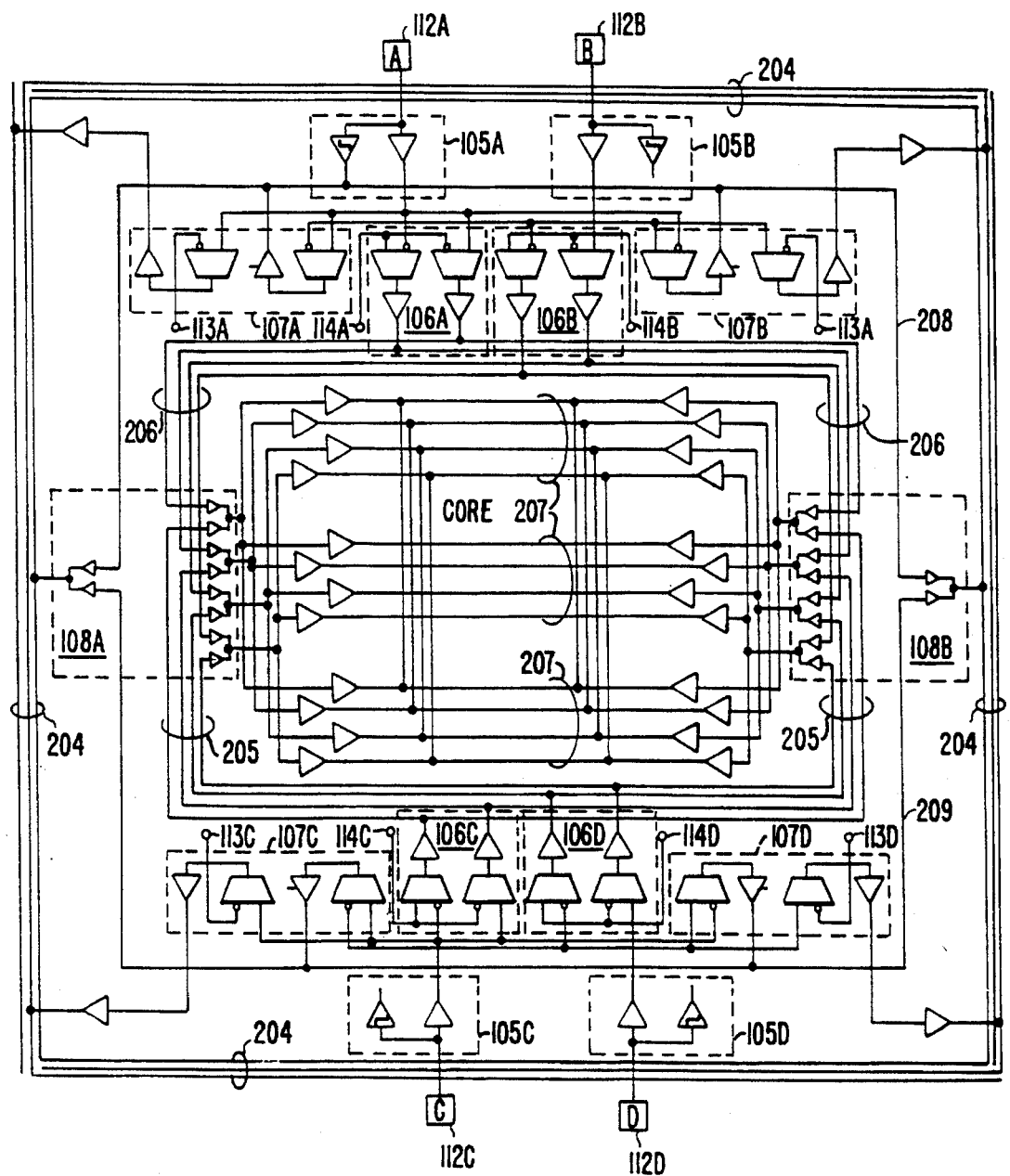
FIG. 14A is a general view of the clock network of the FPGA integrated circuit.

For the timing of operations, the FPGA has many options for timing signals. As described below, the FPGA has a clock network which flexibly provides global clock signals, global enable or reset signals or any other high fanout signal for a user's particular application, as shown in FIG. 14A. The clock network is set by several programmable clock circuits located in the periphery of the integrated circuit die. These clock circuits lie in the 1149.1 serial scan path and, like the input/output buffer circuits 101, are programmed by control signals transferred into the clock circuits by serial scanning, which is depicted representationally in FIG. 14B.

As shown representationally in FIG. 14A, two pairs of input clock pads 112A–112B and 112C–112D, each pair on opposite sides of the integrated circuit, can receive external timing signals. Each input clock pad 112A–112D is connected to a corresponding input clock enabling circuit 105A–105D. Responsive to programmed control signals, each input clock enabling circuit 105A–105D either buffers and passes the signal on the corresponding input pad 112A–112D to the rest of the clock network, or treats the signal on the input pad as a data signal. In that case the incoming signal is conditioned by a Schmitt trigger circuit and passed to data paths different from the clock network. The patent application noted above, U.S. Ser. No. 07/718,667, discloses an input/output buffer circuit in which a Schmitt trigger circuit may be used to condition incoming signals.

From the input clock enabling circuits 105A and 105B, input clock selection circuits 106A and 106B provide a programmable selection of clock signals from the pads 112A and 112B, in either true or inverted form, onto four clock lines 206. Additionally the input clock selection circuits 106A–106B have input terminals 114A and 114B respectively which are connected to core array wiring segments, such as vertical long lines and horizontal channel track segments. The input terminals 114A and 114B provide a way for clock signals already in one pan of the core array 11 to be moved to other pans of the array 11.

Similarly, through the input clock enabling circuits 105C and 105D, input clock selection circuits 106C and 106D provide a programmable selection of clock signals from the pads 112C and 112D, in either true or inverted form, onto four clock lines 208. The input clock selection circuits 106C–106D also have input terminals 114C and 114D respectively which are connected to core array wiring segments to selectively provide clock signal paths from pans of the array 11 to other pans in the array 11.

The two sets of four clock lines 205 and 206 encircle the core array 11 around its periphery. Two programmable clock buffer circuits 108A and 108B cooperatively drive selected signals from the clock lines 205 and 206 onto track segments 207, which run through each channel 17, to provide timing signals in the core array 11. The two buffer circuits 108A and 108B operate cooperatively so that clock signals in the core array 11 are driven simultaneously from both sides to minimize propagation delays.

Clock signals are also provided to the periphery of the integrated circuit die by ring clock lines 204, which run around the periphery of the integrated circuit. Signals on these clock lines 204 (204A–204C) time operations for the input/output buffer circuits 101, for example. A ring clock line 204A runs completely around the periphery of the die. The other lines 204B and 204C are formed by two pairs of L-shaped line segments along two adjoining sides of the periphery. Each L-shaped line segment of a pair is continued around the periphery by the other line segment pair. The position of each pair is rotated 90° so the open and closed corners of the line segment pair do not coincide. Thus on each side of the periphery there are three clock lines 204A–204C.

These ring clock lines 204A–204C may be selectively driven from several sources. The ring clock line 204A may be driven by signals on the clock input pads 112A–112D. Programming of ring clock driver circuits 107A and 107B determines whether signals from the pads 112A and 112B are placed on the clock line 208; programming of the ring clock driver circuits 107C and 107D determines whether signals from the pads 112C and 112D are placed on the clock line 209. Programming of the circuits 108A and 108B selects the signals from the line 208 or 209 for the ring clock line 204A.

The broken ring clock lines 204B and 204C are driven by the programmable ring clock driver circuits 107A–107D, each of which receives one input clock signal from its respective input clock pad 112A–112D and a second. input clock signal from input terminals 113A–113D respectively. Like the input terminals 114A–114D for the input clock selection circuits 106A–106D, the terminals 113A–113D are connected by programming to wiring segments, such as the vertical long lines and horizontal channel track segments, to route signals in the core array 11 to the ring clock lines 204B and 204C. Operations in the periphery of the integrated circuit can be easily timed with the operations in the core array 11.

Figure 15:
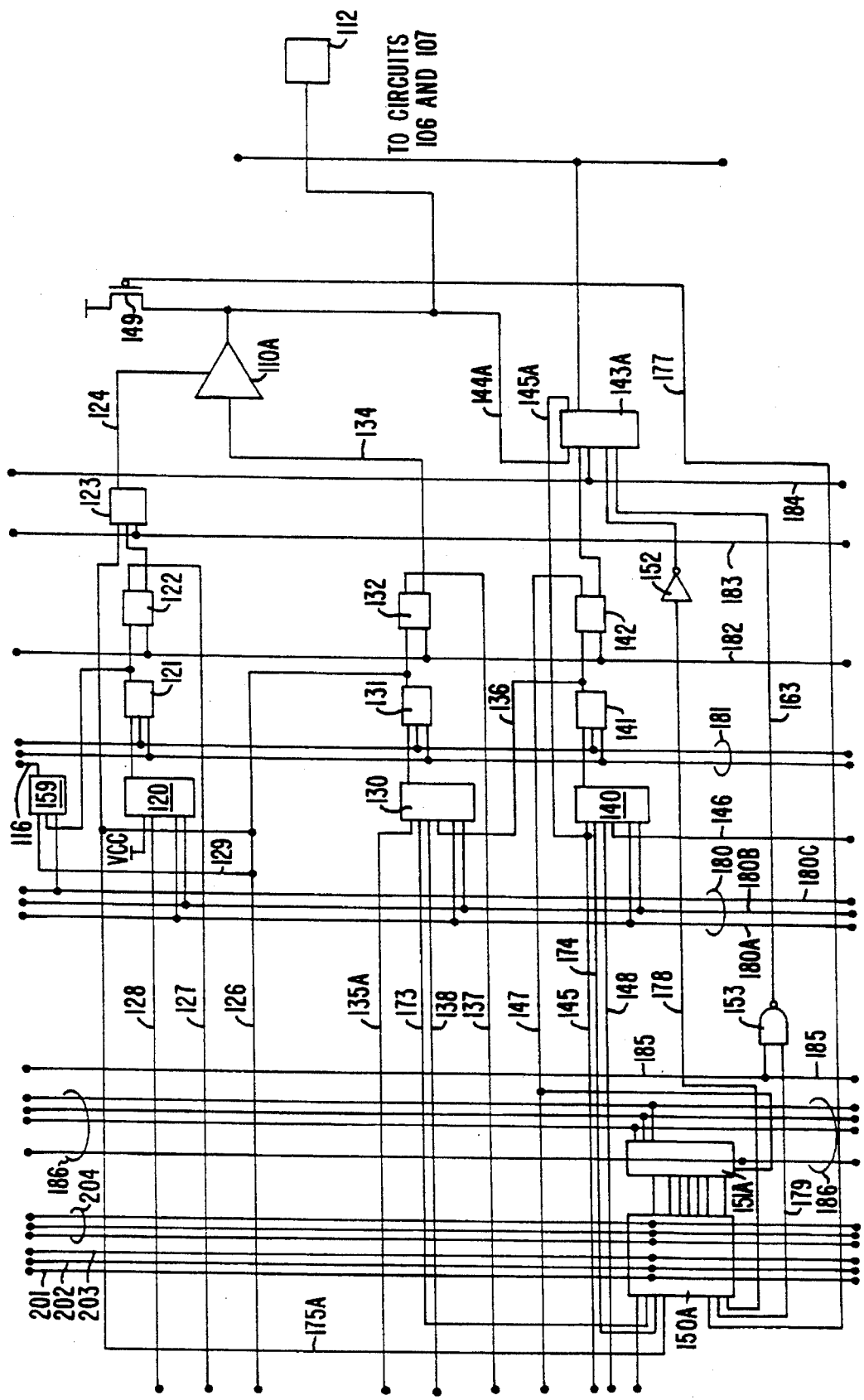
FIG. 15 is a logic circuit schematic of the input clock enable circuit of FIG. 14A.

FIG. 15 details the input clock enabling circuit 105A–105D. The circuit has many of the same elements for the serial scan path as provided for the input/output buffer circuit 101. Hence the same reference numerals are used for the multiplexers 120, 130 and 140, flip-flops 121, 131 and 141, and so forth. Where a modified element in FIG. 15 operates in the same manner and serves the same function as an element in the input/output buffer circuit 101, the same reference numeral is used with an appended letter "A". For example, the programming unit 150A in FIG. 15 operates in the same manner and has the same function as the programming unit 150 in FIG. 11. The same is true for the decoder unit 151A in FIG. 15. Thus the programming unit 150A is programmed in the same way as the programming unit 150 in the input/output buffer circuit 101. The programming signals are sent on the control lines 186 with an enabling signal passed along the 1149.1 serial scan path to the circuit targeted for programming (or pre programming testing).

The circuit in FIG. 15 has a three-input multiplexer (and decoder circuit) 143A. One of the input terminals of the multiplexer 143A is connected to a clock input pad 112

(112A–112D). Another input terminal is connected to a complementary output terminal of the latch 142A. Responsive to control signals from the programming unit 150A, the multiplexer 143A can select signals from either of its two input terminals to either of two output terminals. One output terminal is connected to the input clock selection circuits 106 (106A–106D) and ring clock driver circuits 107 (107A–107D). The second output terminal is connected by the line 145A to an input terminal of the multiplexer 140.

This arrangement allows test signals to be scanned in through the serial scan path and for particular test signals to be loaded into the latch 142A during testing. The inverted test signal in the latch 142A appears to be a fixed signal from the clock input pad 112. This signal is then sent to the input clock selection circuits 106 and ring clock driver circuits 107. Hence dock signals are not required for the pads 112A–112D during testing procedures which are discussed below.

Figure 14B:
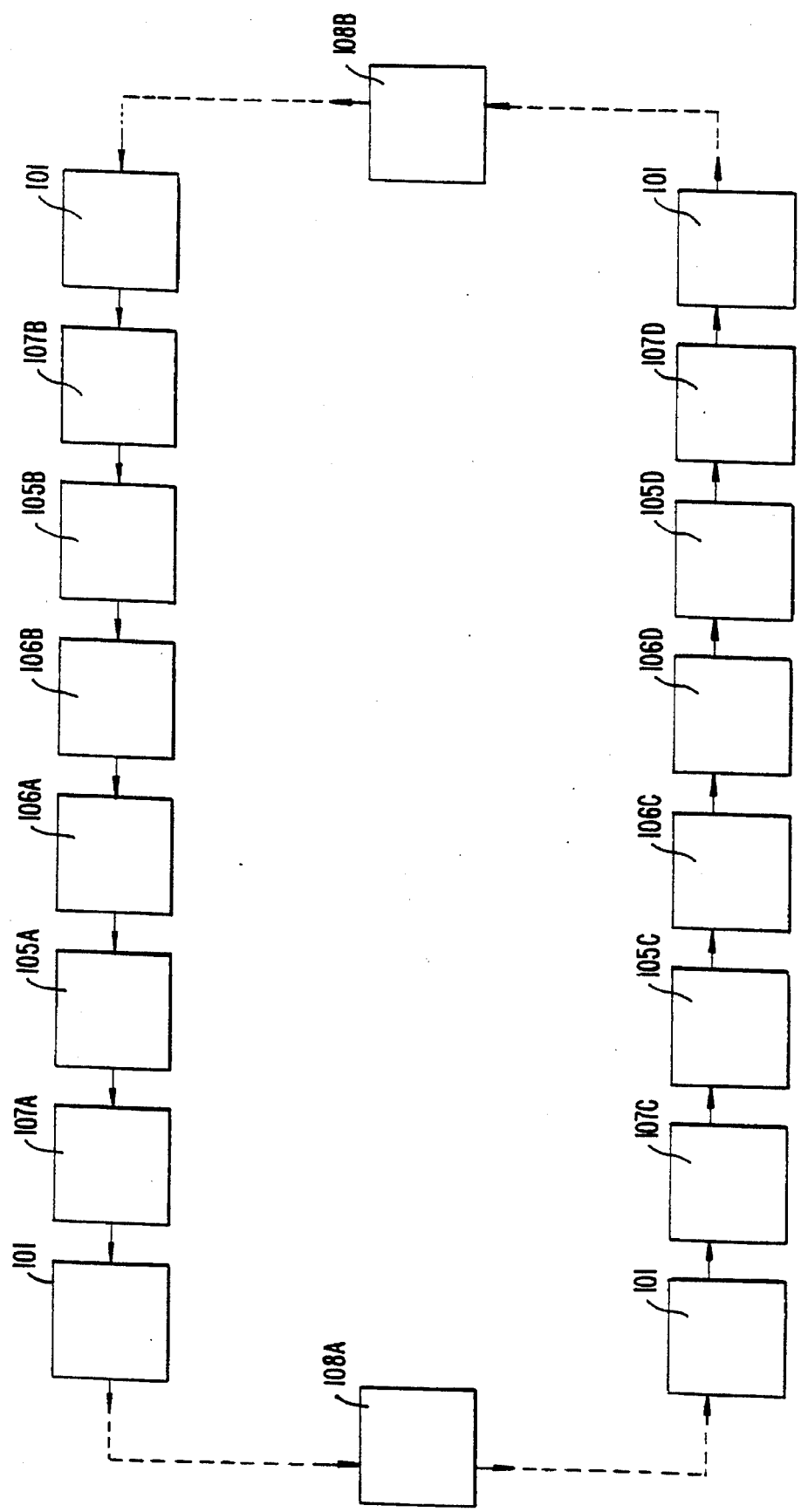
FIG. 14B illustrates the general serial scan path connection between the input/output buffer circuits of FIG. 11 and the various clock circuits of FIG. 14A.

In similar arrangements as the input/output buffer circuits 101 and input clock enabling circuits 105A–105D, the other clock circuits 106A–106D, 107A–107D, and 108A–108B are programmable in the same manner as described for the input/output buffer circuits 101. All the clock circuits are connected in the same 1149.1 serial scan path of the input/output buffer circuits 101 as shown in FIG. 14B. Each circuit contains the first multiplexer-flip-flop-latch-second multiplexer arrangement described for the buffer circuit 101. Likewise, each of the circuits 105A–105C, 106A–106D, 107A–107D, and 108A–108B also contain the same type of programming unit 150 and same self-programming technique for the unit so that the cells route the clock signals along the selected paths for the clock network.

TESTING OPERATIONS

The Core Array

Figure 16A:
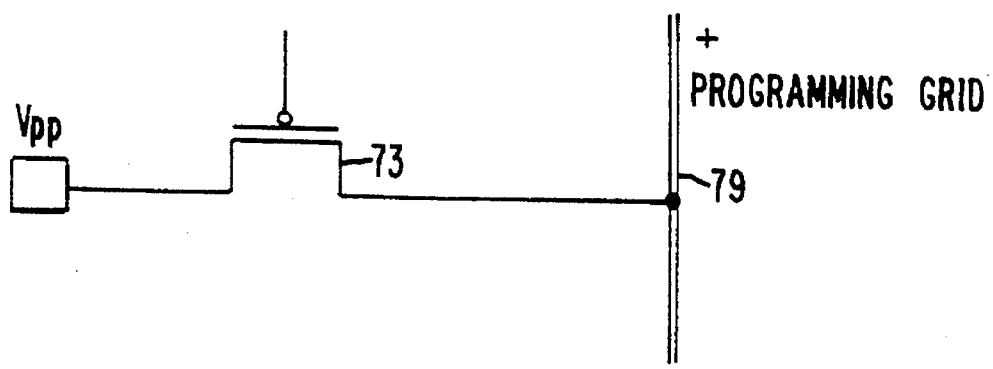
FIG. 16A illustrates the connection between a + programming grid and the $V_{pp}$ programming pin through a programming transistor.

In the core array 11 various elements must be tested before the FPGA is programmed. These include the various wiring segments in the array 11, the transistors in the CST rows 15, and the LLBs in the rows 16. The present invention provides for another function for the circuits used to program the wiring segments of the core array 11. These programming circuits, i.e., the programming transistors and programming grids, are also used for testing. In test operations the $V_{pp}$ pin is driven between logic levels, i.e., +5 and 0 volts, as the + programming address circuits are operated. The $V_{ss}$ pin is kept at ground, zero volts. This is shown symbolically in FIG. 16A and FIG. 8. In this manner voltages, below the requirements for programming the antifuses, are placed in selected locations in the array 11 for the testing operations described below. A third pin, $V_{pb}$, is used during the testing of the isolation transistors for the transistors in the CST row 15.

Despite the $V_{pp}$ pin being held at ground, however, both + and − programming grids may be driven high or low in testing operations. This is achieved by a second programming transistor of opposite polarity to the primary programming transistor which is connected to each programming grid, + or −. If the primary programming transistor is connected to $V_{pp}$ pin, the second programing transistor is connected to the $V_{ss}$ pin, and vice versa.

Figure 16B:
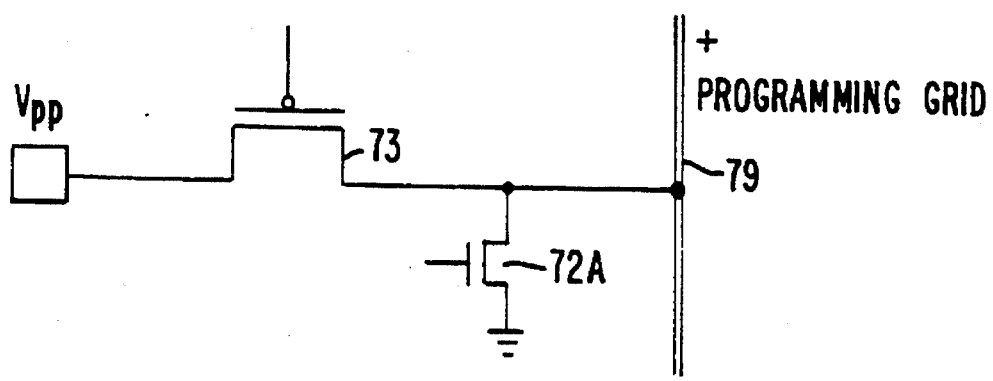
FIG. 16B illustrates the circuit which allows a + programming grid to be pulled low during testing.

In FIG. 16B the primary programming transistor is a PMOS transistor 73 having a source connected to the $V_{pp}$ pin and a drain connected to one of the +programming grids 79. The second programming transistor 72A is a NMOS transistor having a source connected to ground, i.e., the $V_{ss}$ pin, and a drain connected to the programming grid. The gate of the transistor 72A is connected to the same addressing circuit as the transistor 73 so that when the testing function is enabled, the grid 79 can be pulled high to a logic "1" by the transistor 73 or to a logic "0" by the transistor 72A.

Figure 16C:
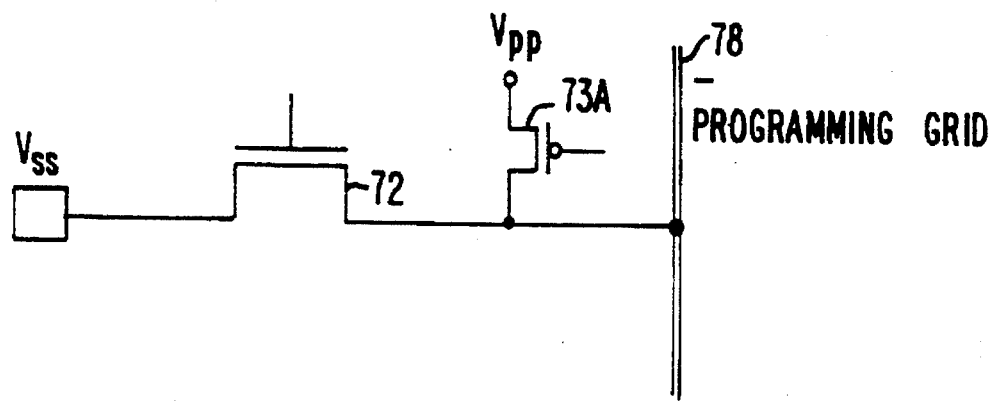
FIG. 16C illustrates the circuit which allows a −programming grid to be pulled high during testing.

FIG. 16C illustrates the complementary situation. The primary programming transistor is a NMOS transistor 72 having a source connected to the programming $V_{ss}$ pin and a drain connected to a − programming grid 78. The second programming transistor 73A is a PMOS transistor having a source connected to the $V_{pp}$ pin and a drain connected to the programming grid 78. The gate of the transistor 73A is connected to the addressing circuit as the transistor 72. When the testing function is enabled, the transistor 73A can connect the grid 78 to the $V_{pp}$ pin, which may be driven either high or low, or the transistor 72 can ground the grid 78 through the $V_{ss}$ pin.

The testing procedures for the various parts of the FPGA are detailed below.

CST Row Transistors, Gate and SD Wiring Segments

Figure 17:
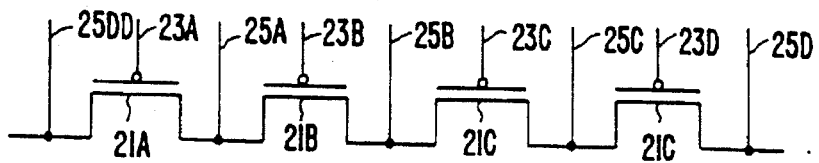
FIG. 17 illustrates a representative group of PMOS transistors in a CST

The integrity of the gate and SD wiring segments of the transistors of a CST row 15 and the functionality of the transistors themselves are tested together. FIG. 17 shows a exemplary isolated row of PMOS transistors 21A–21D of a four-tile group in a CST row 15. The testing proceeds in a stepwise order from left to right. For the transistors in FIG. 16, the gate and SD wiring segments 23DD, 23A and 25A of the transistor 21A on the left are tested. By the convention of this description, the SD wiring segment 25DD is said to be the SD wiring segment of the fourth PMOS transistor of the PMOS transistors immediately to the left of the PMOS transistors depicted and is labeled accordingly.

Figure 18A:
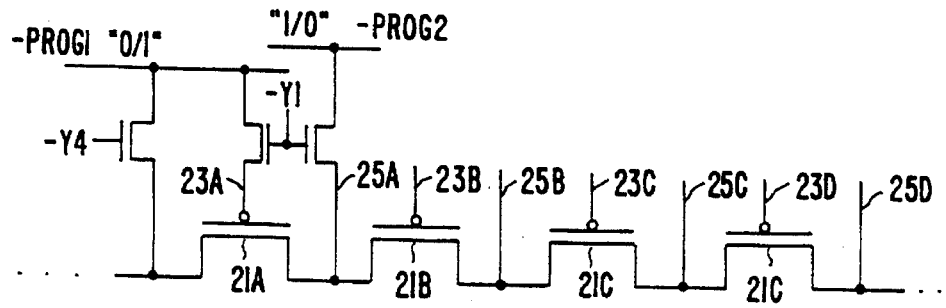
FIGS. 18A–18D show the sequential steps for testing the PMOS transistors in FIG. 17.

As shown in FIG. 18A, the programming control lines −Y4 and −Y1, together with the appropriate X line, turn on the their respective NMOS programming transistors. The SD wiring segment 25DD and the gate wiring segment 23A are connected to the − programming grid, −PROG1, and the SD wiring segment 25A connected to the − programming grid, −PROG2, as indicated by the tables in FIG. 9. The −PROG1 grid is first set to a logic "0" state, while the −PROG2 grid is set to a logic "1" state. If the wiring segments 25DD, 23A and 25A, and the PMOS transistor 21A are functioning properly, the transistor 21A should be turned on and a current should flow through the wiring segments 25DD and 25A. Then the −PROG1 grid is set to a logic "1" state, while the −PROG2 grid is set to a logic "0" state. The transistor 21A should remain off and no current should flow through the wiring segments 25DD and 25A. During this test, all the other wiring segments are set to logic "1", i.e., +5 volts, to keep the other PMOS transistors in the array 11 turned off.

Figure 18B:
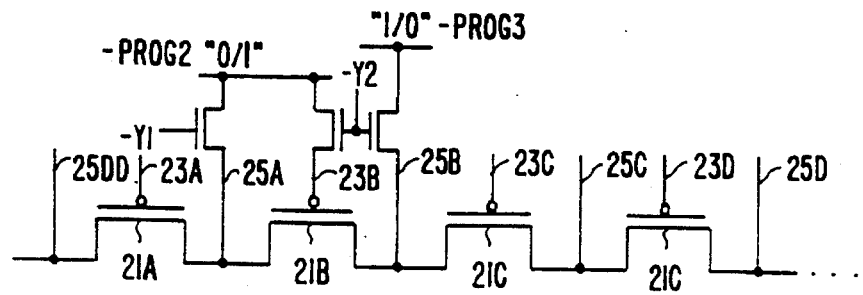

Next, as illustrated in FIG. 18B, the PMOS transistor 221B is tested in a similar manner. While all the other wiring segments associated with the PMOS transistors in the CST rows 15 are set to logic "1", i.e., +5 volts, to keep the other PMOS transistors in the array 11 turned off, the SD wiring segment 25A and the gate wiring segment 23B are connected to the − programming grid, −PROG2, and the SD wiring segment 25B connected to the − programming grid, −PROG3. The tables in FIG. 9 how these connections. The −PROG2 grid is first set to a logic "0" state, while the −PROG3 grid is set to a logic "1" state. If the wiring segments 25A, 23B and 25B, and the PMOS transistor 221B are functioning properly, the transistor 21B should be turned on and a current should flow through the wiring segments 25A and 25B. Then the −PROG2 grid is set to a logic "1" state, while the −PROG3 grid is set to a logic "0" state. The transistor 21B should remain off and no current should flow through the wiring segments 25A and 25B.

Figure 18C:
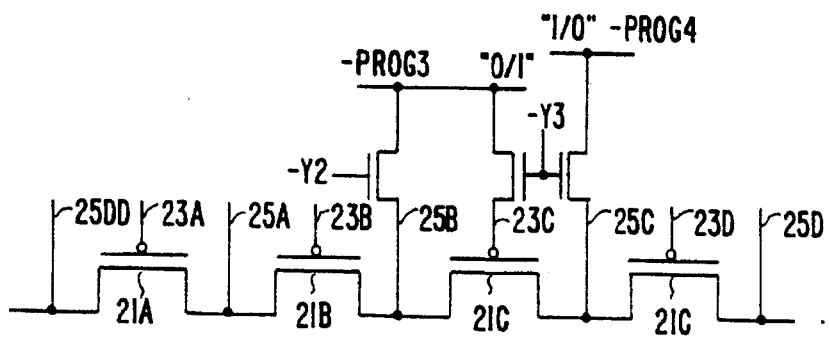
Figure 18D:
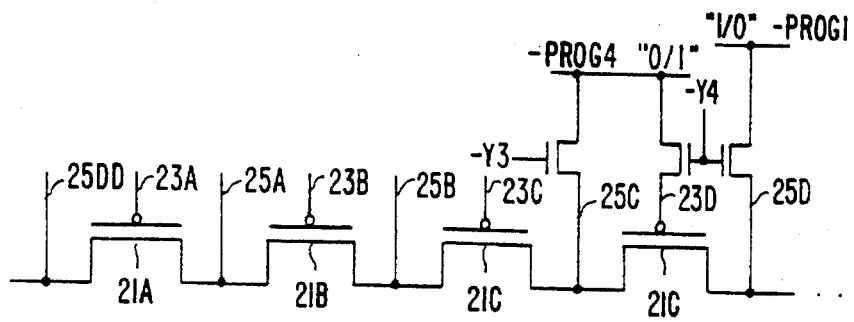

Testing of the transistors 21C and 21D continues sequentially in the same manner and on the next set of PMOS transistors in the CST row, as indicated by FIGS. 18C and 18D. In a similar fashion the NMOS transistors in CST rows 15 are sequentially tested. In this case, however, the polarities of the voltages are reversed.

This arrangement of ±Y1–Y4 control lines and programming grids, −PROG1 to −PROG6 and +PROG1 to +PROG5, combined with the stepped testing of the CST row transistors is the minimum requirement for testing each targeted transistor. On the tables in FIG. 9, the stepped testing of each transistor creates a zig-zag pattern with the three wiring segments for each transistor. The described technique leads correctly to the defective transistors in the array.

Transistor Isolation in CST Rows

The operativeness of the isolation transistors circuits for the PMOS and NMOS transistors in the CST rows 15 may also be tested.

As shown in FIG. 10, the gate of each CST transistor is connected to two isolation transistors. For PMOS transistors 21A–21D, the isolation transistors are PMOS transistors 301A–301D and 311A–311D. The gate wiring segments 23A–23D are used to test these isolation transistors 301A–301D and 311A–311D. For NMOS transistors 20A–20D, the isolation transistors are NMOS transistors 300A–300D and 310A–310D. The gate wiring segments 22A–22D are used to test the isolation transistors 300A–300D and 310A–310D.

To test that all of the isolation transistors turn on, each pair of isolation transistors of a transistor selected from a CST row 15 is addressed at a time. The resulting voltage on the gate wiring segment of the selected transistor is then checked through the programming grid for the wiring segment and the $V_{pp}$ pin. Then the isolation transistors for the next transistor is tested in a identical fashion and so on in a sequential fashion.

For example, the isolation transistors 301C and 311C in the ith CST row are tested by driving control lines 302C and 303i low to turn on the transistors 301C and 311C. In this test mode the $V_{pb}$ pin is set at the positive voltage supply, $V_{cc}$. The address circuits of the programming circuits so that the wiring segment 23C is connected through its programming grid to the $V_{pp}$ pin, which is driven low. If the isolation transistors 301C and 311C are operating properly, the voltage at the $V_{pp}$ pin should be pulled high and a current flows through the pin. By either a voltage or current measurement at the $V_{pp}$ pin, the isolation transistors are tested. Then the sequential testing proceeds to the next two isolation transistors, either left to right, in a CST row.

The testing of the NMOS isolation transistors 300A–300D and 310A–310D is performed in a similar fashion. After a pair of isolation transistors of a selected PMOS transistor in a CST row 15 is turned on, the gate wiring segment 22A–22D of the selected transistor 20A–20D is addressed through the programming circuit for a connection through the programming grid for the wiring segment to the $V_{pp}$ pin. Since the sources of the isolation transistors 310A–310D are at ground, the $V_{pp}$ pin is held at a logic "1". If the isolation transistors are functioning properly, the voltage on the $V_{pp}$ pin is pulled low and a current flows through the pin. The isolation transistors may be tested by voltage or current readings on the $V_{pp}$ pin. The test is moved to the next location and so forth.

To test that the isolation transistors turn off properly, parallel testing is performed. To test the PMOS isolation transistors 301A–301D and 311A–311D, a row of the isolation transistors, for example, are checked at a time. As the isolation transistors 301A–301D of the selected row are turned on, the isolation transistors 311A–311D of the selected row are turned off. At the same time the programming address circuits for all of the gate wiring segments 23A–23D of the selected row connected the wiring segments 23A–23D to the $V_{pp}$ pin, which is held low, at logic "0". Then the isolation transistors 301A–301D of the selected row are turned off and the isolation transistors 311A–311D of the selected row are turned on.

Since no two isolation transistors associated with a gate wiring segment 23A–23D is turned on at one time, there should be no current path from the pin to ground. If one or more of the isolation transistors 301A–301D and 311A–311D in the selected row does not function properly, a current into the $V_{pp}$ pin and the pin is pulled high. The FPGA is defective.

The isolation transistors 300A–300D and 310A–310D are tested identically, except that the $V_{pp}$ pin is held high, at logic "1". If the isolation transistors turn off properly, the $V_{pp}$ pin remains high. If any of the isolation transistors are defective, the $V_{pp}$ pin becomes a current source and the pin is pulled low.

Continuity Tests of Wiring Segments

The continuity of nearly all of the wiring segments in the core array 11 can be tested with the programming circuits. These wiring segments include the horizontal track segments in the wiring channels 17, the vertical and local chevrons 30 and 31, and the long line segments 32.

As described previously, each of these wiring segments is connected to a PMOS programming transistor coupled to the +X, +Y addressing circuits and to a NMOS programming transistor (or NMOS test transistor in the case of track segments in the channels 17) coupled to the −X, −Y addressing circuits. Each of these programming transistors is connected to one end of the wiring segment as shown in FIG. 3. When both PMOS and NMOS programming transistors are addressed simultaneously, a current path is formed by the addressed wiring segment if the integrity of the wiring segment is undamaged.

It should be noted that the NMOS test transistors for the track segments are the same as NMOS programming transistors, except for size. Each test transistor is connected to the end of each segment opposite the end connected to the single PMOS programming transistor. The test transistor is dimensioned large enough to provide a current path for the continuity test. Each test transistor is addressed by the same address circuits ±X, ±Y as used by the programming transistors.

The integrity of the latch segments 33–36, which are connected only to NMOS programming transistors, are tested by the functionality tests on the LLBs 40. These tests are described below.

LLB Functional Testing

The LLBs 40 in the core array 11 are tested by addressing a row of the LLBs simultaneously and reading the resulting output bit signal on the Read/Write lines 55 in parallel. The output signals of the LLBs 40 are captured through the Read/Write lines 55 in the input/output buffer circuits 101 in the periphery 14.

Each wiring segment 33–36, i.e., IN, CLKB, OUT, and FB as shown in FIG. 9, is connected to a unique programming grid. As the grids may be driven both high and low, and logic test signals placed on the global horizontal LLB lines, i.e., the Read Select line 56, complementary Ready Select Low line 57, Write Select line 58, Test Low line 59 and Programming line 60, and the global vertical LLB line, the Column Select line 54, the input signals to the LLB 40 may be completely and uniquely controlled. The combination of input signals may be then set for a resulting output signal on the vertical Read/Write line 55. This output signal is captured in one of the input/output buffer circuits 101. Through the 1149.1 serial scan chain of the input/output buffers 101, these output signals are then shifted out and inspected for correctness. This testing proceeds one LLB row at a time, with the input signals for all LLBs 40 within a row set to the same conditions and the output signals of the entire row captured in parallel in the 1149.1 serial scan chain. This parallel testing greatly enhances the productivity of the testing.

For the LLB tests described above, the Read/Write line 55 is used to carry the test output signal. However, the Read/Write line 55 may also be used as an input line as shown in FIG. 4. In this case, one of the control lines 251 from a programming unit 150 in an input/output buffer circuit sets the test logic state for the line 55. By the operation explained below in testing the input/output buffer 101 itself, the programming unit 150 may set the line 251, and the line 55 to which it is connected, either logic high or low temporarily for testing. To perform this test, a set of input signals for the wiring segments 34–36, i.e., IN, CLKB, and FB, the global horizontal and vertical LLB lines, including the Read/Write line 55, set up the internal state for a row of LLBs 40. The internal state can be read out from each LLB 40 through the OUT wiring segment 33, its programming transistors, programming grids and the programming pin $V_{ss}$. This is done sequentially for all the LLBs in the row and then the next row is tested in the same fashion. Not only are the Read/Write lines 33 tested, but also the OUT wiring segments 33 of each LLB 40.

Fuse Stress Testing

One of the concerns with an antifuse is that it have sufficient margin not to inadvertently program under normal operation. To ensure that this does not happen, each fuse is subjected to a voltage above normal operating voltage, but below the minimum expected programming voltage. In the present FPGA, this test voltage is +6.5 volts. Normal operating voltages range from 0 to +5 volts. Antifuses program at voltages between 8 to 10 volts.

For efficiency, large blocks (1,000 to 10,000) of antifuses, i.e., the wiring segments connected to both sides of the stressed antifuses, are addressed and the test voltage placed across the antifuses simultaneously and sequentially. If one or more antifuses fails and are programmed, a current is created between the $V_{pp}$ and $V_{ss}$ pins. This current is detected and the failed FPGA is discarded.

The performance of these tests greatly enhances the reliability of the products which the customer receives.

Input/Output Buffer Circuits

The input/output buffer circuits 101 are tested through the serial scan chain formed between the input/output buffer circuits 101 (and clock cells 105A–105D, 106A–106D, 107A–107D, and 108A–108B). Note that these tests, performed before the FPGA is programmed, are distinguishable from the tests contemplated by the 1149.1 test standards.

To perform these tests, test control signals are placed upon the control lines 186. An enabling signal is passed through the serial scan chain formed at the beginning by the line 146, multiplexer 140, flip-flop 141 in each buffer circuit 101 shown in FIG. 11. The scan path continues through the multiplexer 130, flip-flop 131, multiplexer 120, flip-flop 121, and finally the multiplexer 159 and on to the next buffer circuit 101 through the line 116. After the enabling signal is captured by the latch 142 of each circuit 101, the circuit is tested for the conditions imposed by the control signals on the lines 186.

The enabling signal is then scanned to the next circuit 101 so that the same test can be performed on that circuit.

As in the case of programming the unit 150, the test control signals from the control lines 186A–186D to the decoder 151 sets the control lines to the programming unit 150. At the same time the precharge control line 200 in the programming unit 150, shown in detail in FIG. 13, is set logic high, i.e., +5 volts. A signal on the control line 201 also turns on the NMOS transistors 190–199 and 209 so that the programming lines 230–239 and 249 and the control lines emanating from the programming unit 150 are nominally high.

The programming lines 230–239 and 249 are set high or low by the lines from the decoder 151. The decoder 151 selectively turns on the NMOS transistors 260–269 and 259, which are connected to ground and are much larger than the NMOS transistors 190–199 and 209. This difference in size allows each of the transistors 260–269 and 259 which are turned on to overcome its corresponding transistor 190–199 and 209, and to pull the corresponding programming line 230–239 and 249 low. The control lines 169–179 of the programming unit 150 are now set for testing the input/output buffer circuit 101.

In most pre programming tests the operation of the decoder 151 responsive to the control lines 186 is sufficient for testing. However, the decoder 151 sets one of the control lines 169–179 and 251 at a time. To test features of the input/output buffer circuits 101 which require the setting of two control lines, the control line 185 is used. With the NAND gates 155 and 157, the control line 185 permits one, or both, of the control lines 160 and 161 to be turned on at the same time during testing. The lines 160 and 161 select the current drive from the output stage 110. Similarly, with the NAND gate 153 the control line 185 can select the logic level for input signals from the terminal 111 while permitting other control lines to be set by the programming unit 150 for testing.

Readings of the test may be performed through the terminal 111.

The Clock Network

Testing of the clock network is performed by first scanning in test control signals through the 1149.1 test path which configure the clock circuits 105A–105C, 106A–106D, 107A–107D, and 108A–108B in the same manner as described for the input/output buffer circuits 101. The test-configured clock circuits route clock signals on the selected paths in the clock network. The integrity of the selected path is tested with the functionality of the clock circuits 105A–105C, 106A–106D, 107A–107D, and 108A–108B. Besides the configuring test control signals, the 1149.1 serial scan path also carries an input clock test signal for the input clock enabling circuits 105A–105D to be passed into the selected path in the clock network. The input clock test signal in the clock network in the core array 11 may be read out through the $V_{pp}$ pin, or optionally, captured in the serial scan path and read out serially.

Then a new set of control signals are scanned to change the clock signal routing paths and a new signal routing path is checked. This procedure is repeated until all the clock signal routing paths are checked.

Figure 19:
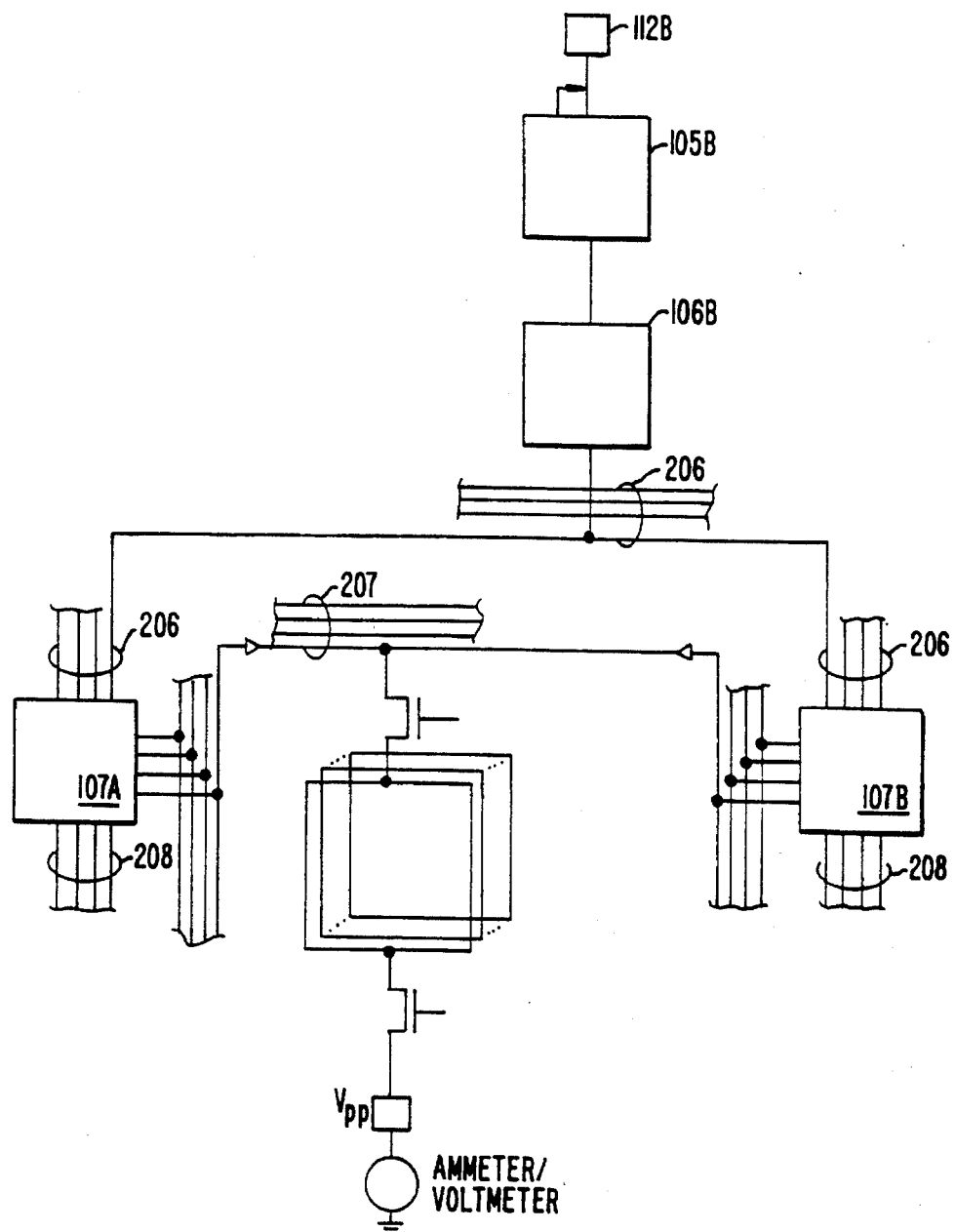
FIG. 19 is a representative signal path through the core array in the testing of the clock network of the FPGA.

FIG. 19 shows a representational selected signal path of the clock network between the clock input pad 112B and one of the horizontal track segments in the channels 17 of the core array 11. Rather than through the input pad 112B, the test clock signal is scanned into the input clock enabling circuit 105B, shown in detail in FIG. 15, through the serial scan chain. From the multiplexer 140 and flip-flop 141, the test signal is captured in the latch 142. The multiplexer 143A sends the test clock signal through the clock input selection circuit 106B, the selected line of the clock lines 206, the clock buffer circuits 108A and 108B, and onto one of the track segments in each of the channels 17 of the core array 11.

Besides the test control signals in the serial scan path for the clock circuits, test control signals in the input/output buffer circuits 101 address a selected track segment in the channels 17 through the programming grids and the programming transistors. Thus the selected track segment is connected to the $V_{pp}$ pin. The test signal in the latch 142 which appears to have been driven on the test pad 112B externally is checked against the signal appearing on the $V_{pp}$ pin by a test circuit, such as an ammeter or a voltmeter connected to the $V_{pp}$ pin.

Alternatively, it should be recalled that the input/output buffer circuits 101 and the clock circuits are connected to selected wiring segments in the core array through the lines 128, 138 and 148. If the selected track segment is connected to one of these lines 128, 138 and 148, the signal on the track segment may be read through the multiplexers 120, 130 and 140 for capture by the flip-flops 121, 131, and 141 respectively. The signal is now in the 1149.1 serial scan path to be read out and tested against the input clock test signal placed in the latch 142.

Clock signal routing paths on the ring clock lines 204A–204C are also checked in a similar fashion. From the input clock enabling circuits 105A–105D, routing paths selected through the input clock selection circuits 106A–106D, clock lines 208 and 209, and clock buffer circuits 108A–108B to the ring clock line 204A may be tested in the same way as described above. The ring clock line 204A is connected to PMOS programming transistors which are connected to the $V_{pp}$ pin. Test signals on one of the clock input pads 112A–112D may be checked against signals received at the $V_{pp}$ pin.

Figure 20:
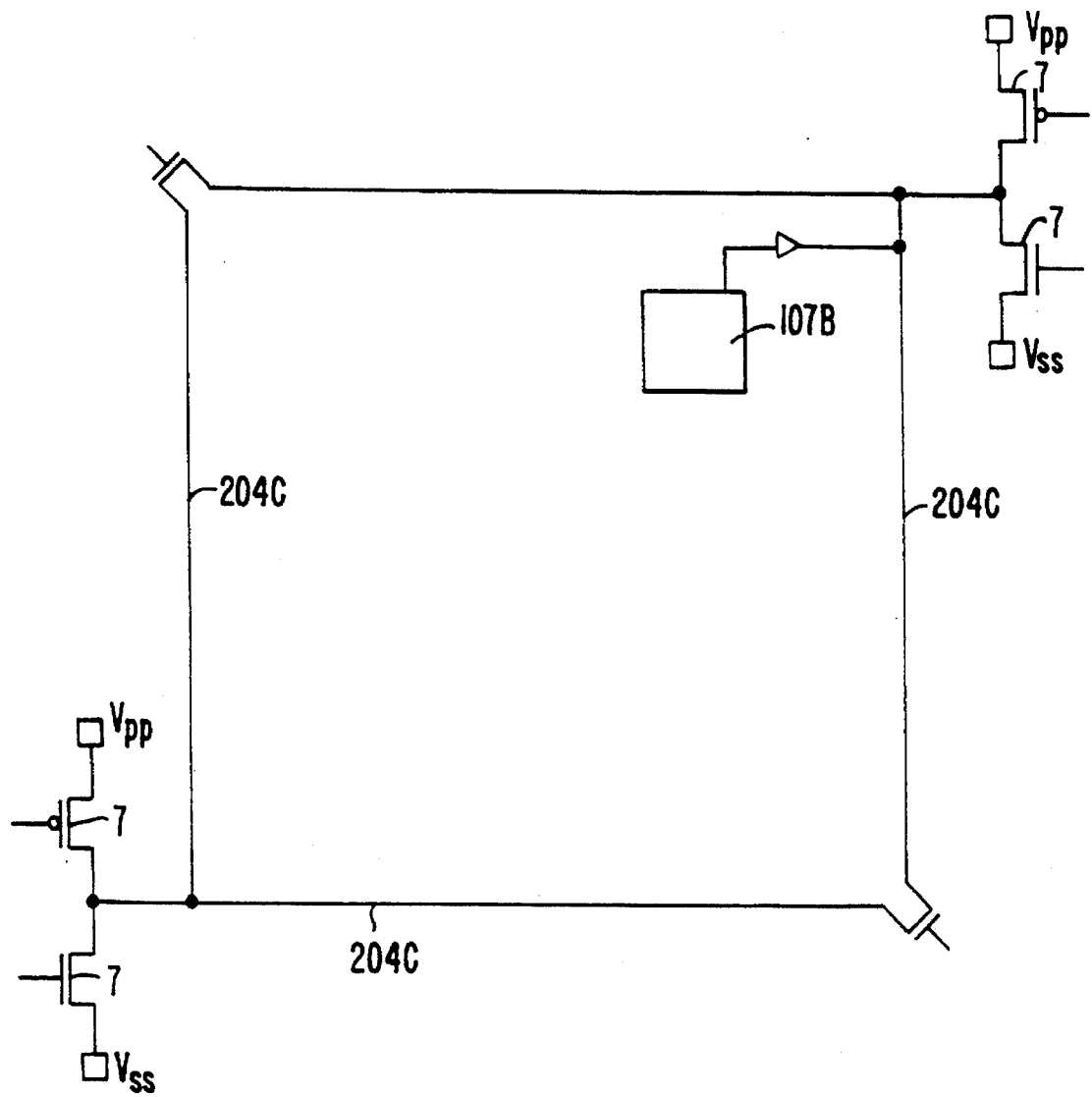
FIG. 20 is a representative signal path around the periphery in the testing of the clock network of the FPGA.

For the broken ring clock lines 204B and 204C, testing is slightly more complex. As shown in FIG. 20, PMOS and NMOS programming transistors (and corresponding $V_{pp}$ and $V_{ss}$ pins) are connected to each corner of the L-shaped wiring segments, here represented by the ring clock line 204C. At the open corners of each L-shaped line segment pair, there is a test transistor to connect the two L-shaped line segments together.

During a test for a routing onto one of the broken ring clock lines 204B and 204C, the test transistors are also enabled to form a complete electrical path for the selected ring clock line 204B or 204C around the periphery. Test signals on one of the clock input pads 112A–112D may be checked against signals received at the $V_{pp}$ pin.

In this manner all possible clock paths can be checked.

Integrated Circuit Speed Characterization Tests

The present invention also provides for process characterization tests, i.e., "binning" tests, for the FPGA integrated circuit. For all integrated circuits, it is desirable to test the speed of the circuitry. Generally, the faster the speed of the circuitry, the better the execution of the manufacturing process for the integrated circuit. Typically test probes on the pads of an integrated circuit pass generated test signals into the integrated circuit and a very short time later output signals are received by the test probes. Expensive, high-speed test machines having switching speeds in the several tens of, perhaps a hundred, mHz are required at present.

The present invention provides for testing with test machines which have a fairly slow switching speed to avoid costly test machines.

The FPGA integrated circuit has its peripheral circuits, such as the input/output buffer circuits 101, input clock enabling circuits 105A–105D, input clock selection circuits 106A–106D, ring clock driver circuits 107A–107D, clock buffer circuits 108A–108B, which are connected in a serial scan chain under the IEEE 1149.1 test standards, as illustrated in FIG. 14B. Multiplexers and flip-flops in each of these circuits are in the path of these serially scanned signals.

The FPGA has a pass-through mode controlled by the control lines 181A and 181B in FIG. 14B by which signals pass from each multiplexer input terminal through the multiplexer output terminal to the flip-flop input terminal and out the flip-flop output terminal to the next multiplexer-flip-flop combination. In effect, the 1149.1 serial scan chain becomes a ring oscillator path 300 illustrated in FIG. 21 in which the inverters 321 are formed from the flip-flops of the peripheral circuits.

As with any ring oscillator, a signal is sent into the data path through the TDI input terminal and the inverters 321. After a measured amount of the time the signal returns through a multiplexer 301 and the TDO output terminal and is registered in a external counter 303. Since the path around the integrated circuit is long, a fairly slow counter 303 in the test machine may be used.

However, this test does not reveal any information about the antifuses which form a large part of the FPGA circuitry. The present invention tests the antifuses by programming a number of antifuses to form a chain 302 of inverters 320 from the transistors in the CST rows 15 in the core array 11. The number of inverters 320 is rather small, approximately 10–50 depending upon size of the core array 11, so that most of the core array 11 is left unprogrammed for the user's benefit. While the chain 302 could theoretically be programmed anywhere in the core array 11, the test programming of the inverters 320 is placed on left edge of the array 11 because of the location of special controllable $V_{cc}$ and ground lines.

The core array chain 302 is added to the peripheral circuit chain 300 so that the test signals must now pass through the inverters 321 and the inverters 320. The time for a signal to make a complete loop and for the counter 303 to register is increased. This increased time, easily measured by the counter 303, is due to the delay from the inverters 320 which are formed by circuit elements including antifuses.

Figure 22:
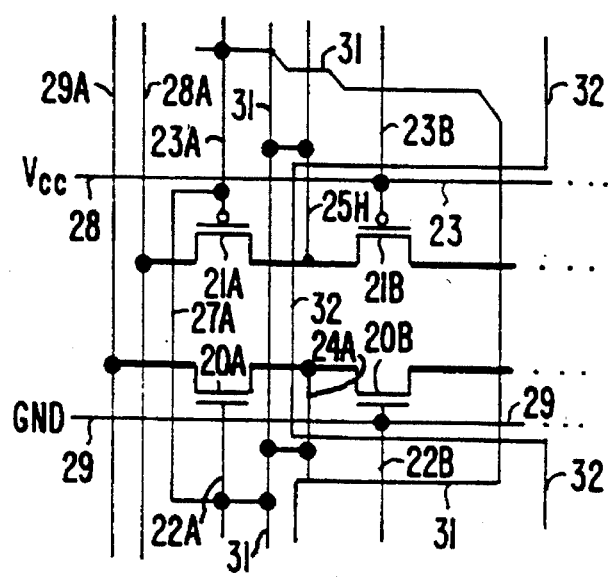

FIG. 22 details how the connections in a CST row 15 are made to form one of the inverters 320. Only the wiring segments and antifuses which form the inverter 320 are shown.

At the left of the array 11 are controllable power supply lines, which are used for the process characterization tests only. During these tests the line 28A is set at the positive power supply voltage, $V_{cc}$, and the line 29A is set at the ground power supply. Otherwise, the lines 28A and 29A are left free-floating. As seen in FIG. 22 the lines 28A and 29A run perpendicularly to and at the left edge of the CST rows 15. The leftmost PMOS transistor 21A and leftmost NMOS transistor 20A of each row 15 has its source connected to the controllable power supply lines 28A and 29A respectively.

To form each inverter 320 in each row 15, the wiring segment 27A is connected to the N gate wiring segment 22A of the transistor 20A by programming the antifuse at the intersection of the wiring segments. The two transistors 21A and 20A form an inverter circuit. The input signal to this inverter circuit travels on a vertical chevron 31 which is connected to the P gate wiring segment 23A (and N gate wiring segment 22A) by a programmed antifuse at the intersection of segments 23A and 31.

Figure 21:
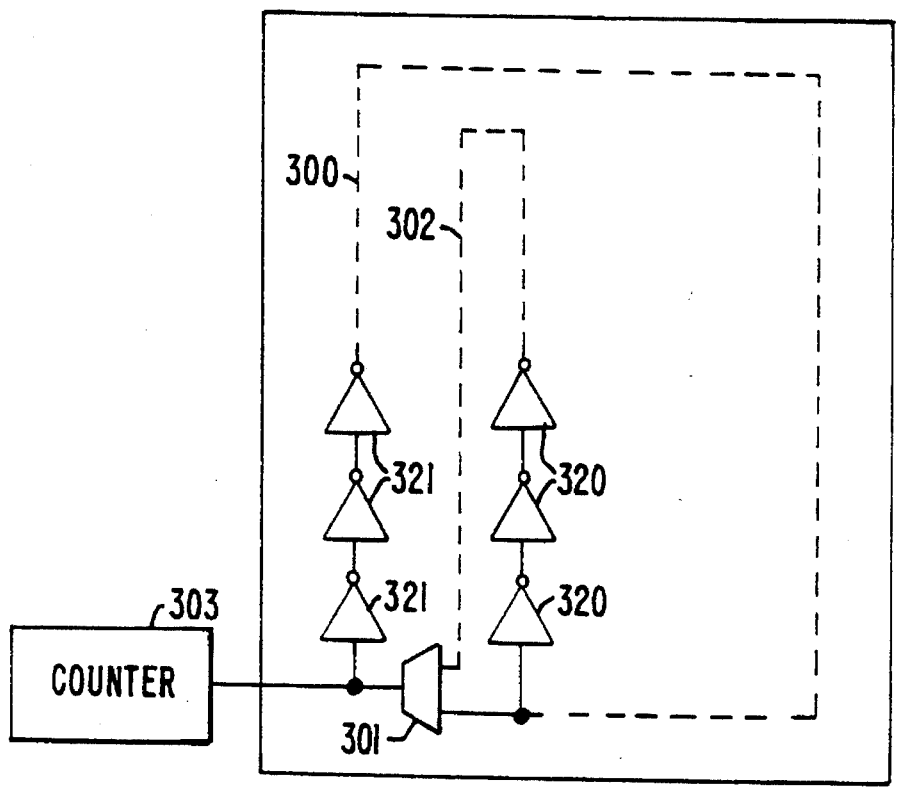
FIG. 21 illustrates the logic gate signal path used for characterizing the process used to manufacture the FPGA.

The output signal of the inverter travels on a vertical chevron 31 which is connected to the SD wiring segments 25A and 24A by programmed antifuses. This vertical wiring chevron 31 carries the input signal to the next inverter in the next CST row 15 above. The return signal to complete the loop to the multiplexer 301 shown in FIG. 21 is a long line 32 shown in FIG. 22.

To isolate the inverter circuit formed by the transistors 21A and 20A, the PMOS transistor 21B and NMOS transistor 20B are turned off. The P gate wiring segment 23B of the transistor 21B is connected to the $V_{cc}$ power supply line 28 and the N gate wiring segment 22B of the transistor 20B is connected to the ground power supply line 29 by programmed antifuses as indicated in FIG. 22. The power supply lines 28 and 29 run through each CST row 15.

Thus a process characterization, including antifuses, of the integrated circuit is achieved without a high-speed test machine. Such a machine would have been required for a direct measurement of the time around the loop 302 alone.

While the above is a complete description of the preferred embodiments of the invention, various alternatives, modifications and equivalents may be used. It should be evident that the present invention is equally applicable by making appropriate modifications to the embodiments described above. For example, while the invention has been described in terms of CMOS technology, the present invention can be applied to other technologies, including bipolar and BiCMOS processes. Therefore, the above description should not be taken as limiting the scope of the invention which is defined by the metes and bounds of the appended claims.

What is claimed is:

1. An integrated circuit having a plurality of terminals for providing electrical paths to and from said integrated circuit, said integrated circuit comprising an array of MOS transistors, each MOS transistor having a first source/drain, a second source/drain, and a gate;

a plurality of line segments connected to said source/drains and gate of each MOS transistor; and means for accessing a selected MOS transistor from selected ones of said terminals responsive to address signals to others of said terminals to create a first path between a first selected one of said terminals and a first selected line segment connected to the first source/drain of said selected MOS transistor, a second path between a second selected one of said terminals and a second selected line segment connected to the second source/drain of said MOS transistor, and a third path between a third selected one of said terminals and a third selected line segment connected to the gate of said MOS transistor, so that said first, second, and third selected line segments are accessible via said first, second, and third paths respectively.

2. The integrated circuit of claim 1 wherein said MOS transistors comprise continuous series transistors.

3. The integrated circuit of claim 2 wherein said accessing means comprises a plurality of grids substantially spanning said array; and circuits connected between each line segment and at least one of said grids, and between each grid and at least one of said terminals, said circuits connecting selected line segments to said one terminal responsive to said address signals.

4. The integrated circuit of claim 3 wherein said circuits comprise a plurality of logic gates, each logic gate generating output signals responsive to said address signals;

a plurality of transistors, each line segment and at least one of said grids having a first transistor connected therebetween, each grid and at least one of said terminals having a second transistor connected therebetween, each transistor responsive to said output signals of one of said logic gates.

5. The integrated circuit of claim 4 wherein said first transistors comprise banks of first transistors, each transistor of a bank connected to line segments proximate to each other and responsive to output signals of one of said logic gates.

* * * * *